(12) United States Patent
Zhang et al.

(10) Patent No.: US 12,020,516 B2
(45) Date of Patent: Jun. 25, 2024

(54) METHOD AND DEVICE FOR PROCESSING PRODUCT MANUFACTURING MESSAGES, ELECTRONIC DEVICE, AND COMPUTER-READABLE STORAGE MEDIUM

(71) Applicant: BOE TECHNOLOGY GROUP CO., LTD., Beijing (CN)

(72) Inventors: Meijuan Zhang, Beijing (CN); Yaoping Wang, Beijing (CN); Zhaoyue Li, Beijing (CN); Yuanyuan Lu, Beijing (CN); Dong Chai, Beijing (CN); Hong Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 939 days.

(21) Appl. No.: 17/044,160

(22) PCT Filed: Dec. 20, 2019

(86) PCT No.: PCT/CN2019/127040
§ 371 (c)(1),
(2) Date: Sep. 30, 2020

(87) PCT Pub. No.: WO2021/120179
PCT Pub. Date: Jun. 24, 2021

(65) Prior Publication Data
US 2023/0142383 A1    May 11, 2023

(51) Int. Cl.
*G07C 3/14* (2006.01)
*B29C 45/76* (2006.01)
(Continued)

(52) U.S. Cl.
CPC ............... *G07C 3/14* (2013.01); *B29C 45/76* (2013.01); *G01N 21/8851* (2013.01);
(Continued)

(58) Field of Classification Search
CPC ....... G07C 3/14; G06F 18/2451; G06F 18/22; G06F 18/213; G06F 18/2148;
(Continued)

(56) References Cited

U.S. PATENT DOCUMENTS 5,481,707 A        1/1996   Murphy, Jr. et al.
2008/0297242 A1   12/2008   Vig et al.
(Continued)

FOREIGN PATENT DOCUMENTS

CN    103458527 A    12/2013
CN    107274471 A    10/2017
(Continued)

OTHER PUBLICATIONS

Intel WPI, "Integrated Industrial Visual Inspection Scheme in Combination with Training and Inference" 10 pages.
(Continued)

*Primary Examiner* — Kyung H Shin
(74) *Attorney, Agent, or Firm* — Leason Ellis LLP

(57) ABSTRACT

A method and a device for processing product manufacturing messages, and an electronic device are disclosed. The method for processing product manufacturing messages includes: monitoring a plurality of product manufacturing messages; establishing a product defect analysis task queue based on the plurality of product manufacturing messages; distributing product defect analysis tasks to product manufacturing assisting devices based on the product defect analysis task queue, wherein the product defect analysis tasks include a task of identifying product defect content based on a defect identification model; wherein the product defect content includes any one or more of: product defect type, product defect location, and product defect size.

19 Claims, 8 Drawing Sheets

(51) Int. Cl.
*G01N 21/88* (2006.01)
*G06F 11/36* (2006.01)
*G06F 18/2451* (2023.01)
*G06Q 10/0639* (2023.01)
*G06T 7/00* (2017.01)
*H01L 21/67* (2006.01)

(52) U.S. Cl.
CPC ...... *G06F 11/3688* (2013.01); *G06F 18/2451* (2023.01); *G06Q 10/06395* (2013.01); *G06T 7/001* (2013.01); *H01L 21/67288* (2013.01); *G01N 2021/8887* (2013.01)

(58) Field of Classification Search
CPC ...... G06F 11/3688; G06F 40/30; G06F 40/40; G06F 40/284; G06F 40/151; G06F 8/42; G06F 11/3684; G06F 40/295; G06T 7/11; G06T 7/73; G06T 7/001; G06T 7/0004; G06T 7/33; G06V 10/764; G06V 20/10; G06V 10/28; G06V 10/255; G06V 10/761; G06V 10/774; G06V 10/776; G06V 10/757; H01L 21/67288; B29C 45/76; G06N 20/00
See application file for complete search history.

(56) References Cited

U.S. PATENT DOCUMENTS

| | | | |
|---|---|---|---|
| 2012/0027288 A1* | 2/2012 | Yuan | G06T 7/001 |
| | | | 382/152 |
| 2015/0324234 A1 | 11/2015 | Chang et al. | |
| 2016/0147883 A1* | 5/2016 | Mukundan | G07C 3/14 |
| | | | 702/81 |
| 2018/0157933 A1 | 6/2018 | Brauer et al. | |
| 2018/0300864 A1* | 10/2018 | Baba | G06F 18/2451 |
| 2018/0331897 A1 | 11/2018 | Zhang et al. | |
| 2019/0093187 A1 | 3/2019 | Lee et al. | |
| 2019/0155633 A1 | 5/2019 | Faulhaber, Jr. et al. | |
| 2019/0204815 A1 | 7/2019 | Ota et al. | |
| 2020/0226742 A1* | 7/2020 | Sawlani | H01L 21/67288 |
| 2020/0264922 A1 | 8/2020 | Kamiya et al. | |
| 2021/0157716 A1* | 5/2021 | Allen | G06F 11/3688 |
| 2021/0232121 A1 | 7/2021 | Pramanick et al. | |
| 2022/0043836 A1 | 2/2022 | Upadhyay et al. | |
| 2022/0245402 A1* | 8/2022 | Tae | B29C 45/76 |

FOREIGN PATENT DOCUMENTS

| | | |
|---|---|---|
| CN | 108268892 | 7/2018 |
| CN | 109800137 A | 5/2019 |
| CN | 110376220 | 10/2019 |
| CN | 110554047 | 12/2019 |
| CN | 110990132 A | 4/2020 |
| CN | 111024708 A | 4/2020 |
| CN | 111738156 A | 10/2020 |

OTHER PUBLICATIONS

S. Karthikeyan, et al., "Design and implementation of CfoTS networks for industrial fault detection and correction mechanism" The Journal of Supercomputing, Sep. 13, 2019, 17 pages.

Office Action in corresponding U.S. Appl. No. 17/429,013 dated May 25, 2023. 28 pages.

* cited by examiner

METHOD AND DEVICE FOR PROCESSING PRODUCT MANUFACTURING MESSAGES, ELECTRONIC DEVICE, AND COMPUTER-READABLE STORAGE MEDIUM

CROSS-REFERENCE TO RELATED PATENT APPLICATIONS

This application is a U.S. National Stage Application under 35 U.S.C. § 371 of International Patent Application No. PCT/CN2019/127040, filed Dec. 20, 2019, which is incorporated by reference in its entireties.

TECHNICAL FIELD

The embodiments of the present disclosure relate to a method and a device for processing product manufacturing messages, an electronic device, and computer-readable storage medium. The present disclosure also relates to artificial intelligence field and big data field, specifically to a system and a method for assisting product manufacturing, and computer-readable storage medium.

BACKGROUND

In the product manufacturing procedure, for example, in the manufacturing procedure of semiconductor products, due to the problems in devices, parameters, operations, environments, and the like, the produced products may not meet the process requirements or even lead to defects. Therefore, it is necessary to immediately calculate and identify defect types, defect sizes, defect positions, and other information of defective products that do not meet the requirements after each process, and make timely correction and improvement to avoid the continuing occurrence of defects. Currently, traditional methods for defect identification mainly rely on manual detection, which requires professional training for inspectors, especially in the case of multiple product models and complex problems. For example, semiconductor products have various types of defects, which may include particle, remain, weak line, hole, splash, electrostatic breakdown, wrinkle, film color, bubble, and the like. It requires a long and dedicated time and attention from inspectors to find defects and make relevant judgments. In summary, the traditional methods for defect identification have problems of low efficiency and low accuracy.

During intelligent product manufacturing, a large number of product manufacturing messages are generated. These product manufacturing messages can be used to indicate the manufacturing process of a product, or to indicate a possible defect of the product in the manufacturing procedure. For example, in the manufacturing procedure of semiconductor products, due to the problems in devices, parameters, operations, environments, and the like, the produced products may not meet the process requirements or even lead to defects. Therefore, it is necessary to immediately calculate and identify defect types, defect sizes, defect positions, and other information of defective products that do not meet the requirements after each process, and make timely correction and improvement.

Currently, the processing of product manufacturing messages, especially those about product defects, still suffers from low processing efficiency. Also, the current processing of product manufacturing messages is still not well coordinated with the product manufacturing procedure, thereby causing inconvenience to product manufacturing.

SUMMARY

A method for processing product manufacturing messages is provided according to at least one embodiment of the present disclosure. The method for processing product manufacturing messages comprises: monitoring a plurality of product manufacturing messages; establishing a product defect analysis task queue based on the plurality of product manufacturing messages; distributing product defect analysis tasks to product manufacturing assisting devices based on the product defect analysis task queue, wherein the product defect analysis tasks comprises a task of identifying product defect content based on a defect identification model; wherein the product defect content includes any one or more of product defect type, product defect location, and product defect size.

An electronic device is provided according to at least one embodiment of the present disclosure. The electronic device comprises a processor; and a memory storing computer instructions that, when executed by the processor, implement the method above.

A computer-readable storage medium with instructions stored thereon is provided according to at least one embodiment of the present disclosure. When the instructions are executed by a processor, the method above is implemented.

BRIEF DESCRIPTION OF THE DRAWINGS

In order to more clearly illustrate the technical scheme of at least one example embodiment of the present disclosure, the following is a brief description of the drawings required to be used in the description of the example embodiment. The drawings in the following description are merely exemplary embodiments of the present disclosure.

DETAILED DESCRIPTION

In order to make the purpose, technical scheme and advantages of the present disclosure more apparent, example embodiments according to the present disclosure will be described in detail below with reference to the accompanying drawings. Obviously, the examples described are only partial examples of the present disclosure, not the entirety of the present disclosure, and it is to be understood that the present disclosure is not limited by the example embodiments described herein.

In the present specification and drawings, steps and elements having substantially the same or similar steps and elements are represented by the same or similar drawings markings, and repetitive descriptions of such steps and elements will be omitted. Also, in the description of the present disclosure, the terms "first," "second," etc. are used only to distinguish the described elements and are not to be understood as indicating or implying relative importance or order.

On one aspect, in the relevant quality inspection procedure of the product manufacturing, there are many unstable factors in manual inspection, which may lead to a decrease in the accuracy of the quality inspection, thus causing potential problems in product quality. On another aspect, in the quality inspection procedure, all the data is manually input, which is inefficient, and at the same time, information obtained manually on an image of a product to be inspected within a limited time is relatively coarse, which brings inconvenience to the subsequent search and analysis of defect causes. Based on all or part of the above reasons, the present disclosure provides the following embodiments.

The products mentioned below include raw materials in the actual manufacturing procedure, as well as semi-finished or finished products after each process (which is performed by devices used for product manufacturing). For example, in the semiconductor industry, products include glasses that have entered the production-line in the very beginning, array substrates that have gone through the exposure process, screens that have gone through cell process, etc. Product images include product images directly obtained by image acquisition devices (such as cameras, automated optical inspection (AOI) devices, etc.), as well as product images that each contain a defect content label (i.e., product images that have gone through the identification of product defect content).

Figure 1:
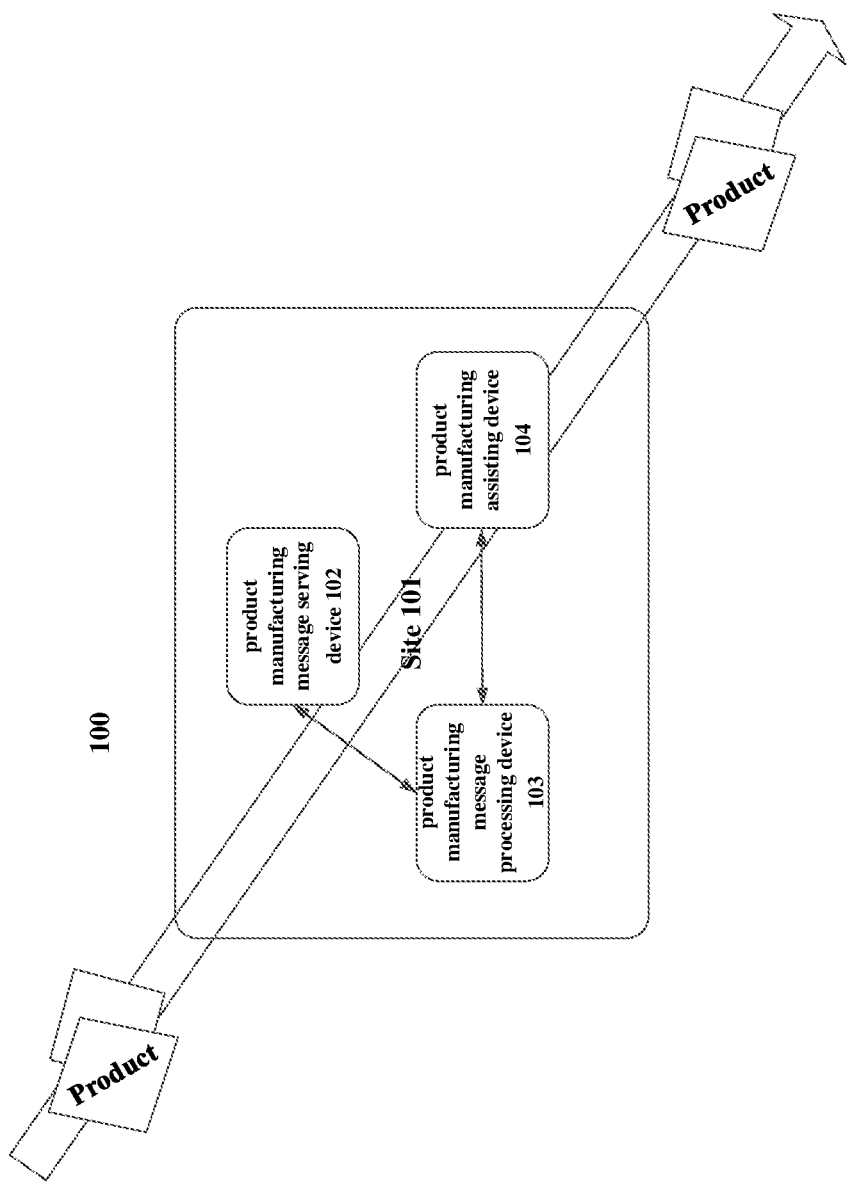
FIG. 1 is a schematic diagram illustrating an example scenario for processing product manufacturing messages.

FIG. 1 is a schematic diagram illustrating an example scenario 100 for processing product manufacturing messages.

As shown in FIG. 1, a plurality of products pass through a site 101 in turn in the scenario 100. The site 101 represents a place-point in the whole production-line flow through which the products may pass.

The site 101 may be a physical device that completes a process in standardized production on a product-line, or a system comprised of multiple physical devices. For example, as for the photolithography process of array substrates in the semiconductor industry, the site 101 corresponding to this photolithography process may include a system comprised of a cleaning device, a pre-baking device, a cooling device, a coating device, an exposure device, a developing device, a post-baking device, a cooling device, etc. The site 101 may also be a single device (an exposure device) corresponding to the exposure process or an AOI device corresponding to image detection. The site 101 may also be a virtual site in the product manufacturing procedure, which represents the steps for processing products in a non-entity form. For example, the site 101 may perform a procedure for defect detection (also referred to as inspection) of the products, which obtains and analyzes all of the procedure information used to detect product defects, and then identifies the product defects. If the products enter the site 101, a trackin message is captured by the site 101. If the products leave the site 101, a trackout message is captured by the site 101. In order to ensure the product quality, product information/product data in the trackin message and the trackout message need to satisfy the requirements of product manufacturing.

The site 101 may include a serving device (102) for product manufacturing messages (hereinafter, referred to as product manufacturing message serving device (102), a processing device (103) for product manufacturing messages (hereinafter, referred to as product manufacturing message processing device (103), and an assisting device(s) (104) for product manufacturing (hereinafter, referred to as product manufacturing assisting device (104). The product manufacturing message serving device (102) may also be excluded from the site 101. The product manufacturing message serving device (102), the product manufacturing message processing device (103), and the product manufacturing assisting device(s) (104) may be computing devices that include processors and memories. These devices may be connected with each other via a network. The above devices may be directly or indirectly communicated with each other. For example, these devices can send and receive data and/or signals via a network. The network may be the Internet of Things based on the Internet and/or telecommunication network, which may be a wired network or a wireless network. For example, the network may be an electronic network that can realize the function of information exchange, such as a local area network (LAN), a metropolitan area network (MAN), a wide area network (WAN), and a cellular data communication network. Each device may use one or more communication protocols to communicate with each other, such as FTP, TCP/IP, HSMS, and Tibco.

In the present disclosure, the site 101 is mainly applied to the detection, analysis, and processing of product defects. It should be understood by those skilled in the art that the site 101 may also be applied to other procedures of product manufacturing.

The product manufacturing message serving device (102) may be configured to capture all or part of the product manufacturing messages in the product manufacturing procedure (for example, the trackin message as above), and broadcast or send these product manufacturing messages to the product manufacturing message processing device (103). The product manufacturing message processing device (103) may be configured to perform further processing on the product manufacturing messages, and send a task message to the product manufacturing assisting device(s) (104) to perform detection and analysis of product defects. The product manufacturing assisting device (104) may include one or more of the following: a device for inspectors to inspect product defects, a device for detecting product defects using an AI defect identification model, a device for deploying an AI defect identification model, a device for training an AI defect identification model, a device for alerting product defects, and the like. The product manufacturing assisting device (104) may return an analysis result to the product manufacturing message processing device (103) after completing the analysis and detection of product defects.

Figure 2:
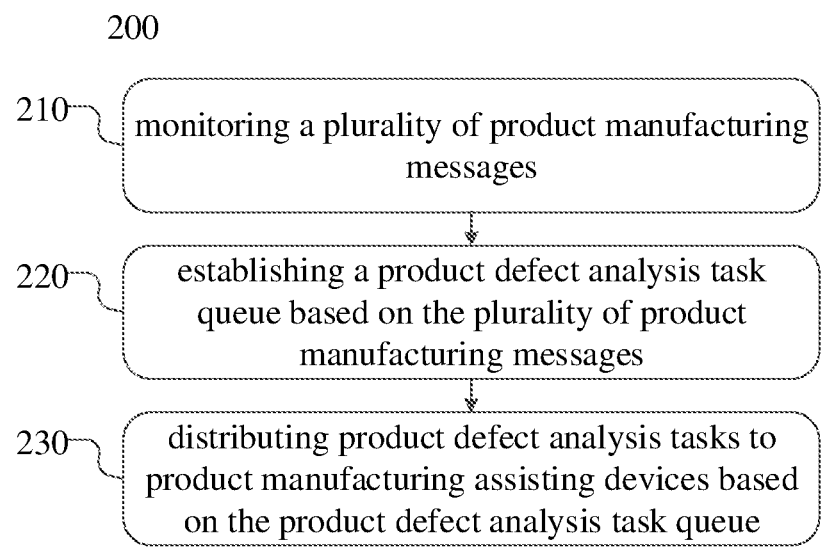
FIG. 2 is a flowchart illustrating a method for processing product manufacturing messages according to at least one embodiment of the present disclosure.

FIG. 2 is a flowchart illustrating a method (200) for processing product manufacturing messages according to at least one embodiment of the present disclosure.

The method (200) for processing product manufacturing messages may include some or all of the operations shown in FIG. 2 (e.g., some or all of operation 210 to operation 230). Of course, the method (200) for processing product manufacturing messages may also include other operations not shown in FIG. 2. The method (200) for processing product manufacturing messages may also be performed by any other electronic device capable of communication and computing. Below, a product manufacturing message processing device (103) is illustrated to perform the method 200, as an example.

See FIG. 2. In operation 210, a plurality of product manufacturing messages may be monitored by the product manufacturing message processing device (103).

During intelligent product manufacturing, a large number of product manufacturing messages are generated. These product manufacturing messages can be used to indicate the manufacturing procedure of a product, or to indicate a possible defect of the product in the manufacturing procedure. The product manufacturing messages may include record information generated by any of the devices used for product manufacturing through which the product passes. Through the product manufacturing messages, it is known that the product has been processed by the product manufacturing device, and other related processing results may also be known. For site 101, the product manufacturing messages include a message for indicating that a product image is generated.

For example, during the detection procedure of screen defects in the semiconductor industry, the product manufacturing device may be the abovementioned Automated Optical Inspection (AOI) device. The product manufacturing device can be configured to perform an optical inspection on the products and capture images of the products in the manufacturing procedure, to determine the differences between the captured product images and standard product images. Based on these differences, the product manufacturing device can determine the presence of product defects in the products being detected. The product manufacturing device may also be other cameras or photographic cameras having an image acquisition function. The product manufacturing device may send captured product images and corresponding files to a product image database. The product image database may be a distributed file system (DFS) or other data storage devices. The corresponding message indicating the generation of product images may include a message indicating that the products have entered a product manufacturing device (e.g., an AOI device) (e.g., a trackin message) and/or a message indicating that the products have left the product manufacturing device (e.g., an AOI device) (e.g., a trackout message), and may also include a message indicating that the product manufacturing device (e.g., an AOI device) generates product image files or a message indicating that product images are sent to the product image database. The product manufacturing device may also be other devices that can be used for product manufacturing, without limitation of this disclosure.

The product manufacturing message serving device (102) may be configured to capture all or part of the product manufacturing messages in the product manufacturing procedure, and broadcast or send these product manufacturing messages to the product manufacturing message processing device (103). The product manufacturing device may also be configured to send product manufacturing messages directly to the product manufacturing message processing device (103). The product manufacturing messages obtained by the product manufacturing message processing device (103) are the plurality of product manufacturing messages which are monitored.

For example, the product manufacturing message serving device (102) includes a manufacturing execution system (MES), and may also include an executive information system (EIS). The product manufacturing message serving device (102) may also be other devices used for monitoring product manufacturing, which is not limited in the present disclosure. Therefore, the product manufacturing messages can be generated by the product manufacturing device or captured by the product manufacturing message serving device (102). The product manufacturing messages may include product manufacturing site information and/or product information. The product manufacturing site information includes the identity of the site, the physical location of the site (e.g., the physical location of the AOI device), the process-node information of the site in the product manufacturing procedures (e.g., defect identification/detection in the exposure process, defect identification/detection in the cleaning process, etc.), etc. The information can be used to assist the product manufacturing message serving device (102) to identify or position a specific site. The product information may be product type, product name, product identity, product priority, etc. This information can be used to assist the product manufacturing message serving device (102) to identify or position a specific product. It should be understood by those skilled in the art that the contents of the product manufacturing messages and the product information are not limited to the above examples, as long as the contents thereof are related to defect identification/detection in the product manufacturing procedure.

The above-mentioned product manufacturing messages include at least one LOT-products manufacturing message and at least one single-product manufacturing message. For example, when screen products of the product production-line are inspected by the AOI device, a single-product manufacturing message (for example, GlassTrackOut message) may be sent as a product manufacturing message from the AOI device to the product manufacturing message serving device (102) after the inspection on one screen (or large glass substrate screen, also referred to as Glass) is completed, and picture files (.jpg/.gls) may be sent from the AOI device to the product image database 203. A single-product manufacturing message may also be sent from the AOI device to all the activated devices in the current factory. The AOI device may also be configured to send a LOT-products manufacturing message by taking a LOT as a unit (1 LOT contains 20 Glass, and each Glass is a single large glass substrate screen). For example, if the inspection of one LOT is completed, a LOT-products manufacturing message (e.g., LotTrackOut message), taken as one product manufacturing message, may be sent from the AOI device to the product manufacturing message serving device (102) or any other relevant devices.

In industrial production, a plurality of products are combined into one LOT, and the same LOT is subjected to the same processing process, so as to facilitate the recording and sorting of the product manufacturing messages. One LOT-products manufacturing message refers to a collection of product manufacturing messages of the plurality of products of the same LOT, and one single-product manufacturing message refers to product manufacturing messages of a single product (such as GLASS). A relatively long cycle is needed to generate a LOT-products manufacturing message and a relatively short cycle is needed to generate a single-product manufacturing message. To improve the processing efficiency of product manufacturing messages, optionally, in operation 210, the monitoring of the plurality of product manufacturing messages also includes: monitoring the LOT-products manufacturing messages by interrupt and monitoring the single-product manufacturing messages by polling. The monitoring the LOT-products manufacturing messages by interrupt refers to, after monitoring the first LOT-products manufacturing message, stopping monitoring until the next LOT-products manufacturing message is generated, and then continue monitoring again. The monitoring the single-product manufacturing messages by polling refers to continuously monitoring a device of generating the single-product manufacturing messages at a preset frequency. In the product manufacturing procedure, the recording and delivery of product manufacturing messages is usually performed in the unit of LOT-products (LOT), which can improve the processing efficiency of messages. However, during the task for analyzing product defects, if only the LOT-products manufacturing messages are monitored, the product manufacturing message processing device (103) and devices for the inspection and analysis of the product defects are often in an idle state. Thus, the product manufacturing message processing device (103) may monitor the LOT-products manufacturing messages by interrupt, monitor the single-product manufacturing messages by polling during interruption intervals, and process the single-product manufacturing messages in a timely manner. The single product corresponding to the single-product manufacturing messages may or may not be one product of the products in the LOT corresponding to the LOT-products manufacturing messages, which allows the processing of most of the single-product manufacturing messages for the LOT to have been completed by the time the LOT-products manufacturing message for the LOT is received. After completing the processing of all product manufacturing messages for the LOT (e.g., one LOT), the processing of product manufacturing messages for the next LOT is then performed, thereby improving the message processing efficiency of the product manufacturing message processing device (103).

Optionally, in order to monitor the LOT-products manufacturing messages by interrupt, the product manufacturing message processing device (103) may also register, with the product manufacturing message serving device (102), information about the LOT-products manufacturing messages it wishes to monitor. The details of the registration procedure will be described in subsequent embodiments of the present disclosure. Thereby, a LOT-products manufacturing message is broadcast by the product manufacturing message serving device (102) to the product manufacturing message processing device (103) after the manufacturing of the LOT of products is completed. The product manufacturing message processing device (103) then receives the LOT-products manufacturing message, and when the LOT-products manufacturing message is received, performs an interruption. During the interruption interval, the product manufacturing message processing device (103) may begin monitoring for single-product manufacturing messages by polling. When a LOT-products manufacturing message is available again, the product manufacturing message serving device (102) broadcasts it to the product manufacturing message processing device (103).

In operation 220, a product defect analysis task queue may be established by the product manufacturing message processing device (103) based on the plurality of product manufacturing messages.

As described above, the site 101 may be taken as a detection site in the entire product manufacturing procedure. Products of different production-lines of the factory may enter the site 101 in the detection procedure. At present, in the factory, due to various types of products and complex processes, a wide variety of product manufacturing sites and complex product defects are present. In this case, the frequency and the quantity of the products flowing into (entering) the site 101 are uncertain, the quantity of products that have flew into (entered) the site 101 and that need to be detected sometimes suddenly increases to a large number, and sometimes is of a small number. Therefore, a reasonable scheduling and distribution of detection tasks for various products is required. In order to make a plurality of product manufacturing assisting devices (104) perform the detection and analysis of the products orderly and efficiently product manufacturing assisting devices (104), the product manufacturing message processing device (103) will establish a product defect analysis task queue based on the received product manufacturing messages to distribute tasks in the order of the product defect analysis task queue.

In operation 230, product defect analysis tasks are distributed to the product manufacturing assisting devices based on the product defect analysis task queue. The product defect analysis tasks include a task of identifying product defect content based on a defect identification model.

Taking product defects as an example, the causes of product defects in the manufacturing procedure vary, such as insufficient strength in the cleaning process, insufficient corrosion, excessive corrosion, inaccurate matching of raw materials, excessive micro-dust in the cleaning environment, insufficient exposure strength, excessive exposure strength, and foreign matter doping, during the semiconductor production procedure. Therefore, further analysis of a product defect is required to obtain the product defect type, defect location (e.g., the circuit board, the layer-level and the mask layer where the defect is located, the specific coordinate position on the board (e.g., the coordinates of the vertices of the peripheral rectangle, which can also be expressed as the coordinates of a vertex plus the length and width), the relationship of the defect to the shape of the background circuit model (e.g., between two lines on a Gate Island, the number of Gate Islands covered by the defect region, whether the defect falls entirely within a Gate Island, intersects the Gate Island, or is near a Gate Island, etc.), and the defect size (e.g., the length of the defect or the area of the defect region (e.g., pixel area).

Different product manufacturing assisting devices (104) may be required for processing different product defect analysis tasks. The product manufacturing assisting devices (104) includes: a first product manufacturing assisting device (104-1) that configures and manages an AI defect identification model, a second product manufacturing assisting device (104-2) that detects and analyzes the product defects in an AI manner, and a third product manufacturing assisting device (104-3) that detects the product defects based on manual intervention, etc. The first product manufacturing assisting device (104-1) may be one or more devices (e.g., a model management cluster) that sets parameters of the AI defect identification model and manages the AI training procedure of the other product manufacturing assisting devices for product manufacturing. The second product manufacturing assisting device (104-2) may be one or more devices (e.g., a product defect analysis cluster) capable of performing inference and training tasks for AI defect identification models and for scheduling and allocation of hardware resources utilizing GPU computational resources. The third product manufacturing assisting device (104-3) may be a terminal (e.g., a product manufacturing client device) that presents product defects to a relevant staff and allows him or her to make a judgment about the product defects. As an example, the product manufacturing client device in a factory can display product defect images to the relevant staff and the relevant staff then judge the product defects, set the relevant information, analyze the relevant data based on the defect images, or the relevant staff may then take a defect judgment examination based on the defect images.

The product defect analysis task also includes a task of identifying product defect content based on the AI defect identification model. The product defect content includes any one or more of: defect type, defect location, and defect size of products. The product defect analysis task may also include a training task of the AI defect identification model. The AI defect identification model includes one or more of: a feedforward neural network AI defect identification model, a convolutional neural network model, a cyclic neural network model, or a generative adversarial network model.

In embodiments of the present disclosure, the task of identifying product defect content based on the AI defect identification model is implemented as follows. Firstly, a product image is scaled to a fixed pixel size M×N (may also be not scaled), and then the M×N image is sent to a deep convolutional neural network (for example, VGG/Resnet/MobileNet, etc.). Secondly, feature maps of the entire M×N image are obtained after the M×N image has passed through multiple convolutional layers, activation layers, and pooling layers. Thirdly, the feature maps are input into a region proposal network (ZF/SSD/RPN, etc.), and proposal regions are obtained by calculation. Fourthly, proposal feature maps of the proposal regions are obtained by performing operations (such as convolution and pooling) on the proposal regions, and the proposal feature maps are sent to the subsequent fully-connected network and a softmax network for classification (i.e, to classify the proposal into a defect type). The defect type with the largest probability is determined as the final classification result, and the defect type and the probability are recorded. In addition, the coordinate and the size of the proposal region represent the position and the size of the defect. The method of identifying the product defect content based on the AI defect identification model can adopt similar variations of the above method or other methods known to those skilled in the art, which is not limited in the present disclosure.

The second product manufacturing assisting device (104-2) can be used to process a product defect analysis task of identifying product defect content from product images using the AI defect identification model. The second product manufacturing assisting device (104-2) may be one or more devices capable of performing inference and training tasks of the AI defect identification model using GPU (Graphics Processing Unit) computing resources.

The AI defect identification model is primarily based on neural networks. For example, an AI defect identification model may be based on a feedforward neural network, i.e., a feedforward neural network model (also referred to as feedforward network). The feedforward network can be implemented as an acyclic graph, in which nodes are arranged in layers. Generally, the feedforward network includes an input layer and an output layer, and the input layer and output layer are separated by at least one hidden layer. The hidden layer transforms the input received by the input layer into a useful representation for generating output in the output layer. Network nodes are fully connected to nodes in adjacent layers via edges, but there are no edges between nodes in the same layer. Data received at the nodes of the input layer of the feedforward network is propagated (namely "feedforwarded") to nodes of the output layer through an activation function. The status of the nodes of each continuous layer in the network is calculated by the activation function based on coefficients ("weights"), and the coefficients are respectively related to each of the edges that connect these layers. The output of the AI defect identification model may adopt various forms, which is not limited in the present disclosure. The AI defect identification model may also include other neural network models such as a convolutional neural network (CNN) model, a recurrent neural network (RNN) model, or a generative adversarial network (GAN) model, but the present disclosure is not limited thereto. Other neural network models that are commonly known by those skilled in the art may also be adopted as the defect identification model.

The second product manufacturing assisting device (104-2) may be further configured to train the neural network model, which mainly includes the following steps: for example, selecting a network topology; using a set of training data that represents problems modeled by the network topology; and adjusting the weights until the AI defect identification model has the smallest error for all instances of the set of training data. For example, in the supervised learning training procedure for a neural network, the output generated by the network in response to an input representing an instance in the training data set is compared with the labeled output "correct" of the instance; the error signal that indicates the difference between the output and the labeled output is calculated; and if the error signal is propagated backwards through the layers of the network, the weights associated with the connections are adjusted to minimize the error. If the error of each output generated from corresponding instance of the set of training data is minimized, the AI defect identification model is construed as "has been trained".

The accuracy of the AI defect identification model can be greatly affected by the quality of the dataset used to train said algorithm (the model). The training procedure can be computationally intensive, so it is beneficial to use GPUs to train many types of AI defect identification models. The calculations performed in tuning the coefficients in the neural network are naturally suited to parallel implementations. Specifically, many machine learning algorithms and software applications have been adapted to use parallel processing hardware within general-purpose graphics product manufacturing message processing devices. It is efficient in processing the calculations associated with training deep neural networks. Thus, the use of a GPU cluster with multiple integrated GPUs can effectively increase the training and inference speed of AI defect identification models. The second product manufacturing assisting device (104-2) can also schedule and allocate the hardware resources.

Thereby, the product manufacturing message processing device (103) may determine whether an AI defect identification model is required for detection according to a product type, whether relevant models need to be trained, and distribute different product defect analysis tasks to the first product manufacturing assisting device (104-1) to the third product manufacturing assisting device (104-3) based on the determination results. For example, a defect content identification task based on an AI defect identification model can be generated for a known product type (e.g., a trained product). For unknown product types (e.g., new untrained products), a defect content identification task based on manual-intervention (e.g., by operators) identification can be generated. In addition, for product images with product defects that cannot be identified by the AI defect identification model (e.g., the AI identification probability is below a preset threshold), the product manufacturing message processing device (103) may also generate a defect content identification task based on the manual-intervention identification. The product manufacturing message processing device (103) can also classify the tasks distributed to the first product manufacturing assisting device (104-1), the second product manufacturing assisting device (104-2), and the third product manufacturing assisting device (104-3) based on the quantity of tasks in the product defect analysis task queue, allowing computer resources and human resources to be used more efficiently.

The method (200) for processing product manufacturing messages according to at least one embodiment of the present disclosure can improve the efficiency of the processing of product manufacturing messages throughout the whole product manufacturing procedure, so that each device involved in the detection and analysis of product defects operates efficiently, facilitating subsequent finding and analysis of causes of the product defects, and improving the efficiency of product manufacturing.

Figure 3:
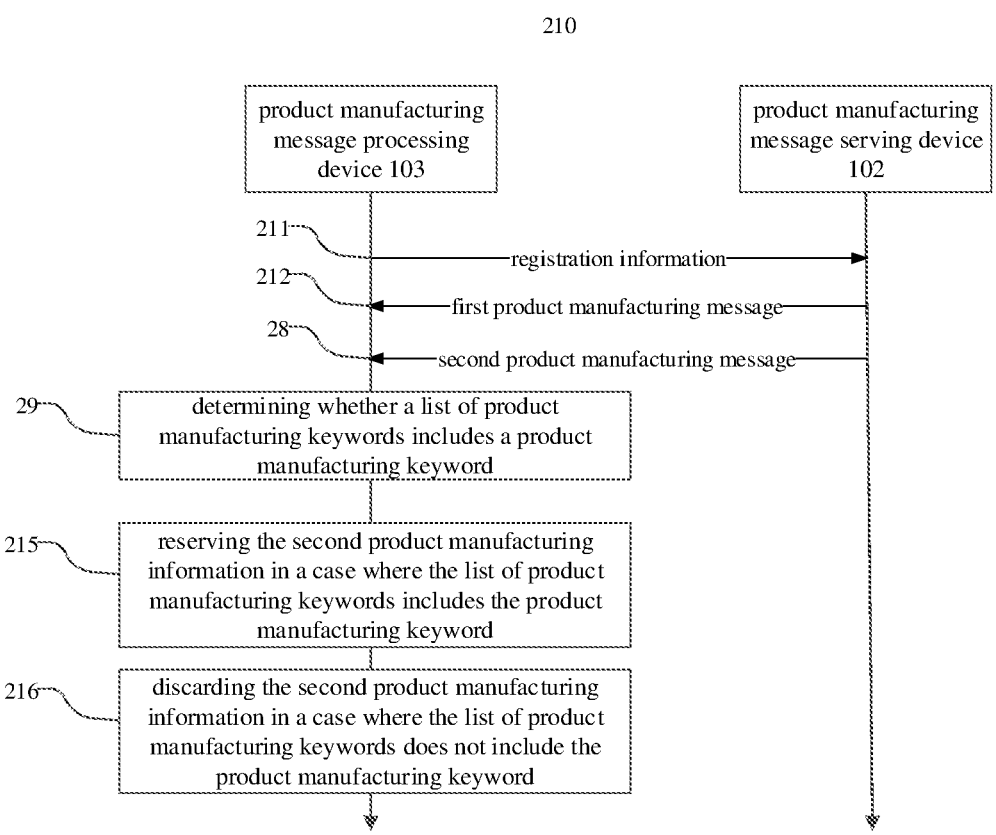
FIG. 3 is another flowchart illustrating the method for processing product manufacturing messages according to at least one embodiment of the present disclosure.

FIG. 3 is another flowchart illustrating the method (200) for processing product manufacturing messages according to at least one embodiment of the present disclosure, which illustrates the procedure of obtaining product manufacturing messages in the method (200) for processing product manufacturing messages, e.g., some or all sub-operations of the operations 210 described above.

In sub-operation 211, a registration information is sent from the product manufacturing message processing device (103) to the product manufacturing message serving device (102). The registration information includes product manufacturing site information and/or first product information.

Through the registration information, the product manufacturing message serving device (102) can be aware of what product manufacturing messages related to the registration information the product manufacturing message processing device (103) would like to know. The product manufacturing messages related to the registration information include product manufacturing site information or first product information. Thus, when the product manufacturing messages related to the registration information have been collected, the product manufacturing message serving device (102) can preferentially broadcast the product manufacturing messages. Thus, the product manufacturing message processing device (103) can monitor the product manufacturing messages by interrupt.

The product manufacturing site information includes one or more of: the identity of the site, the physical position of the site (for example, the physical position of the AOI device), the process-node information of the site in the product manufacturing procedure (for example, defect identification/detection in the exposure process, defect identification/detection in the cleaning process, etc.), etc. This information can be used to assist the product manufacturing message serving device (102) to identify or locate a specific site. The first product information may be one or more of: product type, product name, product identification, product priority, etc., which can be used to assist the product manufacturing message serving device (102) identify or locate to a specific product. It should be understood by those skilled in the art that the contents of the product manufacturing site information and the first product information are not limited to the above example, as long as the contents are related to defect identification/detection in the product manufacturing procedure.

In sub-operation 212, based on the registration information, a first product manufacturing message sent from the product manufacturing message serving device (102) is monitored by the product manufacturing message processing device (103), in which the first product manufacturing message includes product manufacturing messages related to the registration information. The first product manufacturing message may be a LOT-products manufacturing message or a single-product manufacturing message, as long as the first product manufacturing message is related to the product manufacturing site information or the first product information in the registration information. If the first product manufacturing message is related to the product manufacturing site information, the first product manufacturing message may include site variation information, site status information, and the like identified by the product manufacturing message serving device (102). If the first product manufacturing message is related to the first product (e.g., the first product information), the first product manufacturing message may include the address where the product images of the product are stored, the number of product images captured with respect to the product, the manufacturing procedure of the product, etc.

In sub-operation 213, a second product manufacturing message sent from the product manufacturing message serving device (102) is monitored by the product manufacturing message processing device (103), in which the second product manufacturing message is not related to the registration information. The product manufacturing message serving device (102) can use the same port to broadcast the first product manufacturing message and the second product manufacturing message, and may also use different ports to broadcast the first product manufacturing message and the second product manufacturing message, which is not limited in the present disclosure. Optionally, the second product manufacturing message may include information that is not related to the content of the registration information, for example, the temperature, the humidity, and the like of the current factory environment. Of course, the second product manufacturing message may be a LOT-products manufacturing message and may also be a single product manufacturing message.

In sub-operation 214, it is determined by the product manufacturing message processing device (103) whether the list of product manufacturing keywords includes a product manufacturing keyword in the second product manufacturing message.

In the case where the product manufacturing keyword in the second product manufacturing message is included in the list of product manufacturing keywords, in sub-operation 215, the product manufacturing message processing device (103) reserves the second product manufacturing message.

In the case where the product manufacturing keyword in the second product manufacturing message is not included in the list of product manufacturing keywords, in sub-operation 216, the product manufacturing message processing device (103) discards the second product manufacturing message.

The registration of the product manufacturing message processing device (103) to the product manufacturing message serving device (102) may require more procedures, such as configuration and verification by relevant staff. However, in the factory, products may be continuously adjusted and updated. There may be cases where information about a new product needs to be obtained in time but the product manufacturing message processing device (103) cannot register to the product manufacturing message serving device (102) timely. Thus, the product manufacturing message processing device (103) may also monitor messages which are not related to the registration information.

For example, the messages which are not related to the registration information may be monitored by polling. Product manufacturing keywords, which are not related to the registration information but related to the identification, detection and analysis of product defects, are stored in the list of product manufacturing keywords. When the second product manufacturing message is received, the product manufacturing message processing device (103) can analyze fields in the second product manufacturing message, compare these fields with the list of product manufacturing keywords, and reserve the second product manufacturing message containing any product manufacturing keywords in the list. For example, assuming that relevant staff finds that the product defects in the screens produced in the last few LOTs are likely to be caused by excessive environmental humidity, the relevant staff can add the keyword "environmental humidity" in the list of product manufacturing keywords. Subsequently, when the messages related to environmental humidity are received, the product manufacturing message processing device (103) can reserve such messages so as to facilitate the relevant staff to perform the analysis. When the influence factors such as environmental humidity are excluded, the relevant staff can remove the keywords related to environmental humidity in the list of product manufacturing keywords, so as to reduce redundant information stored in the product manufacturing message processing device (103) and improve the message processing efficiency of the product manufacturing message processing device (103). In the whole procedure of acquiring environmental humidity information, the product manufacturing message processing device (103) does not need to register to the product manufacturing message serving device (102), thereby reducing the procedures of processing the product manufacturing messages.

By adoption of this mechanism, the product manufacturing message processing device (103) can preferentially monitor registered information, and meanwhile, filter non-registered information according to the product manufacturing keywords. The product manufacturing message processing device (103) not only monitors the registered information but also can monitor messages sent by all the product manufacturing message serving devices (102), thereby improving the expandability of the system.

In the procedure of monitoring and broadcasting the product manufacturing messages, the factory manufacturing system has a high requirement for the processing of the product manufacturing messages. Optionally, to avoid message loss, the product manufacturing message processing device (103) may also have the functions of message cache and message queue. The product manufacturing message processing device (103) can cache the product manufacturing messages in RabbitMQ for message queue management to avoid the problem of message loss caused by delay or other abnormalities.

Figure 4:
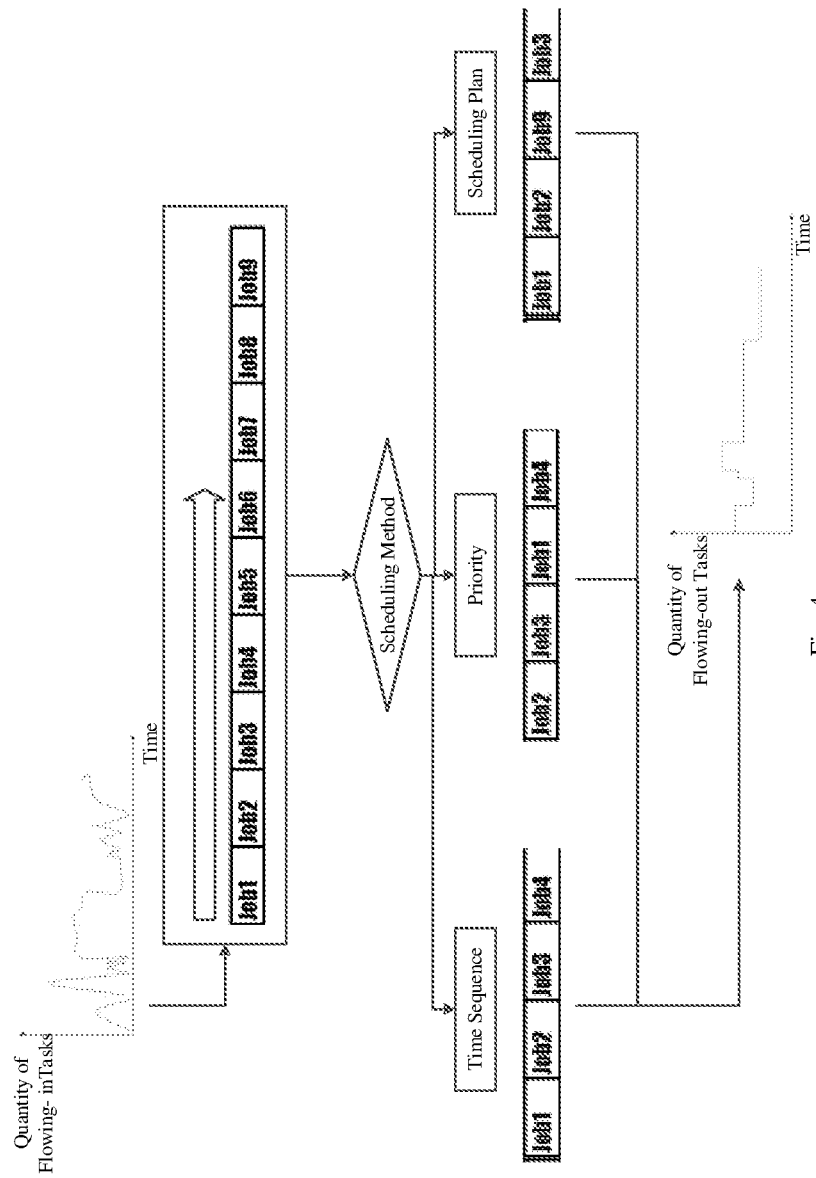
FIG. 4 is a schematic diagram illustrating the method for processing product manufacturing messages according to at least one embodiment of the present disclosure.

FIG. 4 is a schematic diagram illustrating the method (200) for processing product manufacturing messages according to at least one embodiment of the present disclosure. FIG. 4 illustrates the procedure of establishing a product defect analysis task queue in the method (200) for processing product manufacturing messages.

As shown in FIG. 4, as the frequency and the quantity of the products entering the site 101 are uncertain, the quantity of products that have been entered the site 101 and that need to be detected sometimes suddenly increases to a large number, and sometimes is of a small number. The quantity of tasks flowing into the site over time can be shown in a flowing-in task quantity graph.

If tasks flowing into the site are not scheduled, the product manufacturing assisting device (104) to perform the detection and analysis will sometimes be over-stressed and sometimes relatively idle, so the processing efficiency of the product defect analysis tasks can be low. The product defect analysis task queue is disposed in the product manufacturing message processing device for product manufacturing messages and provides a time buffer between the production of the product images by the image acquisition device and the performing of the product defect analysis tasks by the product manufacturing assisting device for product manufacturing. The product defect analysis tasks in the product defect analysis task queue include product defect analysis tasks to be performed. The product manufacturing message processing device for product manufacturing messages can control the speed of distributing tasks in the product defect analysis task queue according to the load status of the product manufacturing assisting device for product manufacturing. If the quantity of the product manufacturing messages is greater than a preset message threshold, and/or the quantity of tasks in the product defect analysis task queue is greater than a preset task threshold, and/or the load of the product manufacturing assisting device is greater than a preset load threshold, the speed of distributing tasks is reduced. If the quantity of the product manufacturing messages is less than the preset message threshold, and/or the quantity of tasks in the product defect analysis task queue is less than the preset task threshold, and/or the load of product manufacturing assisting device for product manufacturing is less than the preset load threshold, the speed of distributing tasks is increased.

Optionally, the product manufacturing message processing device (103) establishes the product defect analysis task queue based on the plurality of product manufacturing messages also includes: sorting the product defect analysis tasks based on any one or more of: the order in which the product manufacturing messages are received, priorities of the products, and a product scheduling plan to establish the product defect analysis task queue.

In the cases, the sorting of the product defect analysis tasks based on the order in which the product manufacturing messages are received is to facilitate the scheduling of tasks according to time sequence. That is to say, according to the sequence of the monitored product manufacturing messages entering the queue to be processed, the corresponding hardware resource match is performed. As shown in FIG. 4, assuming that 9 product manufacturing messages are received in turn and 9 product defect analysis tasks Job1 to Job9 are established on this basis, and then the 9 tasks can be arranged according to the order in which the 9 tasks are received. The manner of sequential scheduling is simple to set, and can be better matched with the production plan in terms of time.

The sorting of the product defect analysis tasks based on the priorities of the products includes scheduling according to the set product priorities, that is, sorting according to the priorities of the products in the production plan. The entire message queue for the scheduling is dynamically changed, and products with high priorities may be inserted into front positions of the product defect analysis task queue. As shown in FIG. 4, assuming that the priorities of Job2 and Job3 are higher than those of Job1, then, Job2 and Job3 may be arranged before Job1 for processing. The scheduling based on priority can ensure the detection tasks of the products with high priority are successfully completed first.

The sorting of the product defect analysis tasks based on the product scheduling plan may allow scheduling staff to be able to specify a corresponding scheduling plan, and meanwhile, support temporary insertion and adjustment of the scheduling plan. For example, as shown in FIG. 4, Job9 is temporarily inserted between Job2 and Job3. Thus, the scheduling staff can focus on monitoring and verifying certain products or defects, and at the same time, can integrate other information on the production-line to temporarily intervene in the jobs of the entire production-line.

Some embodiments of the present disclosure can combine any one or more of the above three methods to sort the product defect analysis tasks to establish the product defect analysis task queue. As shown in FIG. 4, the quantity of tasks flowing out from the site remained more or less even over time after the scheduling (as shown by a flowing-out task quantity graph). The embodiments of the present disclosure can perform reasonable scheduling and allocation on the detection and/or analysis tasks of various products, and then perform reasonable allocation on computing resources and tasks, so as to satisfy the needs of actual production at maximum efficiency.

Figure 5:
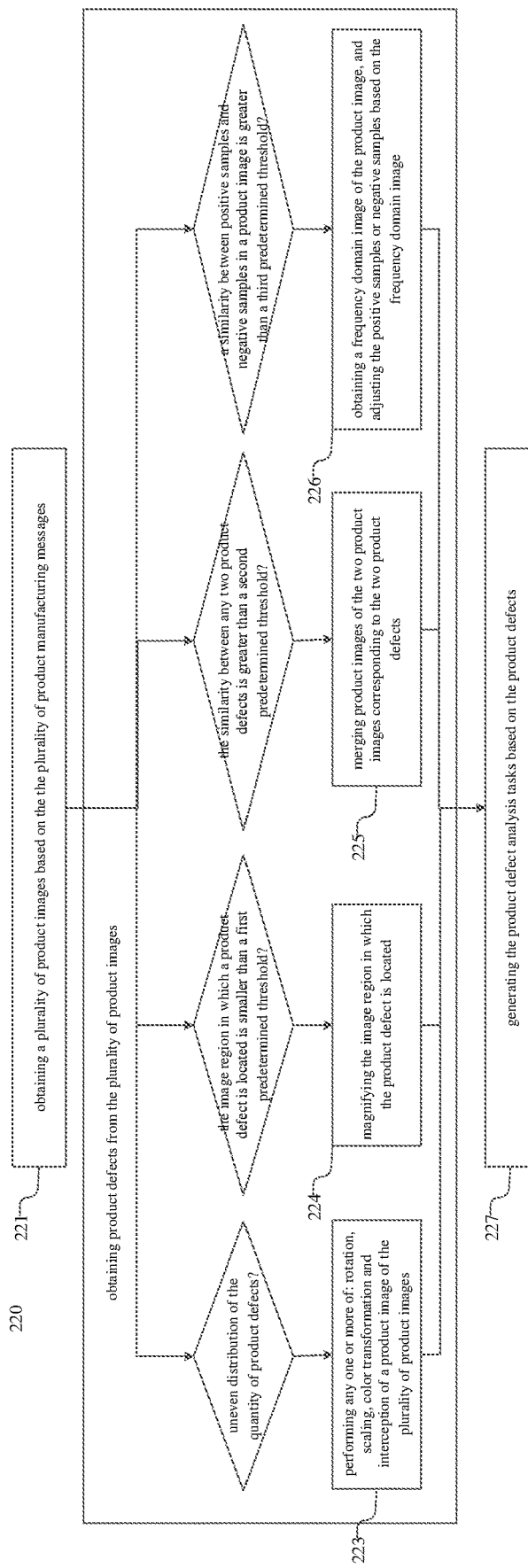
FIG. 5 is another flowchart illustrating the method for processing product manufacturing messages according to at least one embodiment of the present disclosure.

FIG. 5 is another flowchart illustrating the method (200) for processing product manufacturing messages according to at least one embodiment of the present disclosure, which illustrates an example of operation 220.

Referring to FIG. 5, operation 220 may include all or a part of sub-operations 221 through 227.

In sub-operation 221, a plurality of product images are obtained by the product manufacturing message processing device (103) based on the plurality of product manufacturing messages. Since an AOI device captures a large number of high-resolution product images during product defect detection (an AOI device may take a plurality of images of a single large glass substrate screen), the AOI device sends these images to a product image database (such as a DFS system) for storage. The product manufacturing messages sent by the AOI device includes fields indicating specific locations in the product image database where the images are to be stored, so that the product manufacturing message processing device (103) can retrieve these product images from the product image database.

In sub-operation 222, product defects are obtained by the product manufacturing message processing device (103) from the plurality of product images. The product manufacturing message processing device (103) will perform a preliminary analysis of these product images to obtain the product defects. For example, the product manufacturing message processing device (103) may locate locations of the product defects, and indicate a quantity of product defects, and the like. In some embodiments, the images to be analyzed are encoded, the encoded images are then detected, to identify anomalous portions that do not conform to particular rules, in order that the anomalous portions therein are eliminated and corrected. The images with anomalous portions eliminated and corrected are decoded and the decoded images are compared to the images to be labeled to obtain the defect location, defect size, and quantity of defects, etc.

If an AI defect identification model corresponding to product defects is present, the product manufacturing message processing device (103) may generate a product defect analysis task for identifying the product defects or inferring the causes of product defects (identifying product defects includes identifying information about the defect type, defect location, etc. of the product defects). If the AI defect identification model corresponding to the product defects is not present, the product manufacturing message processing device (103) may generate a product defect analysis task that trains the AI defect identification model. The product manufacturing message processing device (103) may send a query to the model management cluster described above to inquire whether an AI defect identification model exists. The product manufacturing message processing device (103) may also query its internally stored list of AI defect identification models to inquire whether the AI defect identification model is present. The present disclosure does not limit the manner in which the product manufacturing message processing device (103) inquires whether an AI defect identification model is present.

Due to the wide variety of product defects and their varying distributions, the product manufacturing message processing device (103) pre-processes these product images in order to facilitate the product manufacturing assisting device (104) to obtain better analysis results or better AI defect identification models.

For example, the distribution of the quantity of product defects in a large glass substrate screen may be uneven. For example, the quantity of defects located in the middle of the glass substrate may far exceed the quantity of defects at the edges of the glass substrate. If pre-processing is not performed, it may lead to excessive deviation of data in the training set of the AI defect identification model, which in turn may lead to poor effect of identification using the AI model. Product defects may also be inconspicuous, e.g., on a large glass substrate screen, defects may only be present in a very small region of pixel blocks. If such an image is fed directly into the AI defect identification model, it may also result in poor effect. The characteristics between multiple product defects may also be obscure, and product defects from different causes may have similar characteristics, which may also lead to poor effect of identification. To identify product defects, a large number of AI defect identification models may be trained in site 101. However, when these models are trained, the contrast between positive and negative samples in the product images may not be obvious, resulting in poor effect of identification using the AI defect identification models at the training site. In summary, if product images are not pre-processed, it may result in increased difficulty and poor effect of identification of the product manufacturing assisting device (104).

Thus, the product manufacturing message processing device (103) may make the following determinations and perform the following processes on the product images to improve the identification effect of the AI defect identification model. Optionally, operation 222 also includes any one or more of sub-operation 223 to 226.

In sub-operation 223, in the case of an uneven distribution of the quantity of product defects, the product manufacturing message processing device (103) performs any one or more of: rotation, scaling, color transformation, and interception on a product image. Often, data skewness, variance, and the like can be used to determine whether product defects are evenly distributed. For example, if the product manufacturing message processing device (103) determines that the quantity of product defects in the product image has a data skewness greater than a predetermined data skewness, the quantity of product defects may be determined to have an uneven distribution. To identify whether there is an uneven distribution of the quantity of product defects, the product manufacturing message processing device (103) may periodically perform sample counts according to product and site to see changes in the distribution. The product manufacturing message processing device (103) can expand product images that have a small quantity of defects but have high process requirements. For example, the product manufacturing message processing device (103) may perform the following processing on these product images: rotation, scaling, color transformation, interception, etc. These processing means may expand the quantity of relevant samples, thereby allowing the AI defect identification model to more effectively identify product defects.

In sub-operation 224, in the case where the image region where a product defect is located is less than a first predetermined threshold, the image region where the product defect is located is magnified by the product manufacturing message processing device (103). The first predetermined threshold can be the maximum area of the product defect region, the maximum ratio of the product defect region to the image region, etc. For large product images with small product defect regions, the product manufacturing message processing device (103) can perform simple image processing. For example, the product manufacturing message processing device (103) may initially screen out similar images and perform image segmentation. The product manufacturing message processing device (103) may then process the segmented image, e.g., magnify the region where the defect is located.

In sub-operation 225, in the case where the similarity between any two product defects is greater than a second predetermined threshold, product images with said any two product defects are merged by the product manufacturing message processing device (103). The second predetermined threshold may be the maximum similarity of any two product defects. The similarity of the product defect images may be characterized by cosine similarity, Euclidean distance, or Manhattan distance, which is not limited in this disclosure. In a case where the features between product defects are not obvious, the product manufacturing message processing device (103) can merge similar product defects for processing during coarse classification and subsequently perform a refine the processing. In the phase of training the AI defect identification model, the product manufacturing message processing device (103) may merge different product defects with similar features for processing in order to increase the overall number of samples. The sample set of an increased number will be used as samples for training the AI defect identification model.

In sub-operation 226, in the case where the similarity between positive samples and negative samples in the product image is greater than a third predetermined threshold, a frequency domain image of the product image is obtained by the product manufacturing message processing device (103), and the positive or negative samples are adjusted based on the frequency domain image. The third predetermined threshold may be a minimum similarity between the positive samples and the negative samples. In response to the above-mentioned case where the positive and negative samples are too similar, the product manufacturing message processing device (103) may adjust the images of the positive samples and the negative samples by means of image processing to decrease the similarity between them. The product manufacturing message processing device (103) may obtain the frequency domain image via a Fourier transform or wavelet. The statistical characteristics of positive and negative samples in the product image is then calculated and analyzed based on the obtained frequency domain image. Based on these statistical characteristics, the product manufacturing message processing device (103) may initially process the frequency domain image (e.g., pass it through any one or more of a high-pass filter, a low-pass filter, or a band-pass filter to enhance the frequency domain image) and then convert the frequency domain image to a time domain image by inverse transformation. Afterwards, the inspector or reviewer can review labels of positive and negative samples and determine if the converted image is distorted. This greatly reduces the manual workload and increases the speed of sample collection.

In sub-operation 227, product defect analysis tasks are generated by the product manufacturing message processing device (103) based on the product defects.

The product manufacturing message processing device (103), after pre-processing the product defects, can generate a product defect analysis task based on analysis results of the product defects and the adjusted product image.

The product defect analysis tasks may include a product defect analysis task that trains an AI defect identification model, a product defect analysis task that performs AI inference on the causes of product defects, a product defect analysis task that performs AI inference and identification of product defect content (i.e., a task of identifying product defect content based on an AI defect identification model), a product defect analysis task that sets up an AI defect identification model, a product defect analysis task that allows relevant staff to review samples of product defect models (AI defect identification models), and a product defect analysis task that allows relevant staff to make judgments about product defects, or the like. There is no limitation to the types of product defect analysis tasks in this disclosure, as long as it is associated with product defect analysis.

After the product defect analysis tasks are generated, the product manufacturing message processing device (103) will establish a product defect analysis task queue and distribute the product defect analysis tasks to the product manufacturing assisting devices (104) based on the product defect analysis task queue.

Optionally, the product manufacturing message processing device (103) may also obtain product type and product defect analysis task type from the plurality of product manufacturing messages, and, based on the product type and the product defect analysis task type, generate a product defect analysis request message and distribute the product defect analysis tasks by sending the product defect analysis request message. The product defect analysis request message may also include a product level (e.g., task priority).

The product manufacturing messages sent from the AOI device and the product manufacturing message serving device (102) may include statistical information for an entire LOT of products (e.g., one LOT of products) or all manufacturing messages for a single product. There are a large number of fields in these messages that are not relevant to product defect identification. Thus, the product manufacturing message processing device (103) is required to parse the product manufacturing messages, while in accordance with the requirements of the product manufacturing assisting device (104), encapsulating them into product defect analysis request messages that the product manufacturing assisting device (104) can identify. For example, during product manufacturing message analysis, the product manufacturing message processing device (103) may obtain the quantity of AOI color images, the product type of the AOI color images, the size of the AOI color images, and the like, for a LOT of products. The AOI color images may be images of the semiconductor screens taken at any step of being substrates, deposition, etching, and box. In generating the product defect analysis request message, the product manufacturing message processing device (103) needs to determine the product type to be analyzed in the product defect analysis task, and the type of product defect analysis task to be performed (e.g., inference, training, status query, etc.). Afterwards, the product manufacturing message processing device (103) may also perform message format verification on the product defect analysis request message, and then distribute the product defect analysis tasks to the product manufacturing assisting devices (104) by sending the product defect analysis request message after determining that the format of the product defect analysis request message is qualified. The type of product defect analysis task is used to indicate different product defect analysis tasks.

Figure 6:
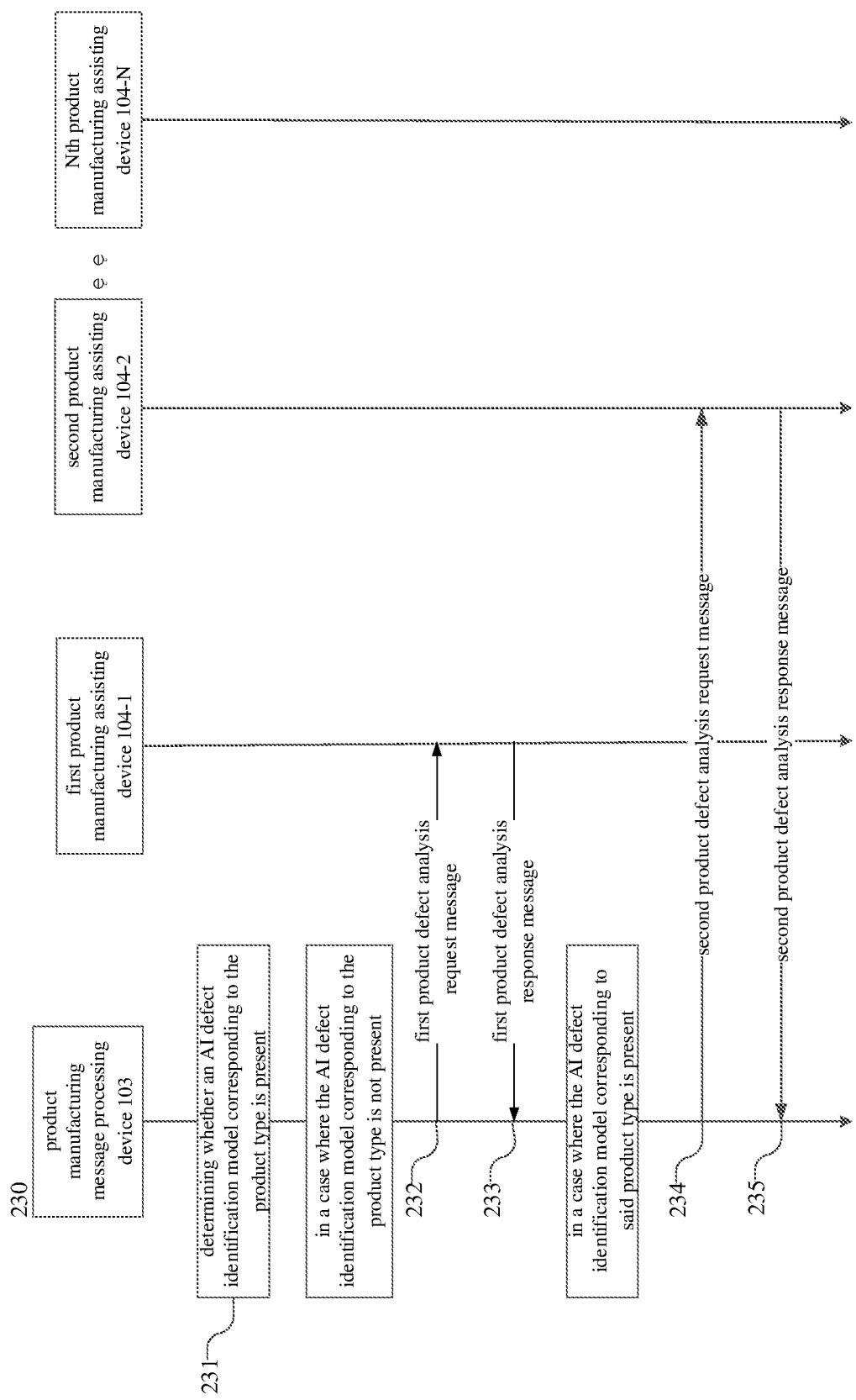
FIG. 6 is another schematic diagram illustrating the method for processing product manufacturing messages according to at least one embodiment of the present disclosure.

FIG. 6 is another schematic diagram illustrating the method (200) for processing product manufacturing messages according to at least one embodiment of the present disclosure.

See FIG. 6, optionally, the distribution of the product defect analysis tasks by the product manufacturing message processing device (103) to the product manufacturing assisting devices based on the product defect analysis task queue also includes sub-operations 231 to sub-operations 235.

In sub-operation 231, it is determined by the product manufacturing message processing device (103) whether an AI defect identification model corresponding to the product type is present.

The determination by the product manufacturing message processing device (103) that whether an AI defect identification model corresponding to the product type is present includes: determining based on the product type in the product manufacturing messages.

If the product type indicates a known product (i.e., a trained product) and it is determined that an AI defect identification model corresponding to the product type is present, the product defect analysis tasks may be performed based on the AI defect identification model corresponding to the product type.

If the product type indicates an unknown product (i.e., an untrained product), it is determined that the AI defect identification model corresponding to the product type is not present.

If the product type is known product type, but the product defect content cannot be identified based on the AI defect identification model corresponding to the product type (for example, the identification score is lower than a preset threshold), it may also be determined that the AI defect identification model corresponding to the product type is not present. Optionally, the identification score represents the probability that the AI defect identification model identifies the product defects of the defect type.

If the performances of the AI defect identification model are insufficient to satisfy the product defect analysis tasks (e.g., the accuracy, the precision and the recall are lower than a preset threshold) corresponding to the product type, it may also be determined that the AI defect identification model corresponding to the product type is not present.

The product manufacturing message processing device (103) may also determine whether the AI defect identification model corresponding to the product type is present by other means such as manual detection and defect identification model prejudgment. There is no limitation to how the product manufacturing message processing device (103) determines whether the AI defect identification model corresponding to the product type is present in the present disclosure.

In the case where the AI defect identification model corresponding to the product type is not present, in sub-operation 232, the product manufacturing message processing device (103) sends a first product defect analysis request message to the first product manufacturing assisting device (104-1). The first product defect analysis request message includes the product type, the storage address of product images, the quantity of product images, and the task identity for training an AI defect identification model (the task identity indicates training an defect identification AI model corresponding to the products of the product type by utilizing the storage address of the product images and the quantity of the product images). The first product defect analysis request message corresponds to the distribution of the model training task in the product defect analysis tasks. The first product manufacturing assisting device (104-1) may be a model management cluster, which may perform functions such as configuring or managing, for example, the training of the AI defect identification model. For example, the first product manufacturing assisting device (104-1) can realize the function of managing the training task of the AI defect identification model.

Due to the large number of products and sites, the use of general AI defect identification models will not solve all problems, so there is a need to provide various AI defect identification models to make judgments about different types of products. There may also be a need to fine-tune the product models during the production in a factory. For example, when the manufacturing procedure in the production-line of the factory changes, or after a change in production equipment, the resulting AOI images will change. Such changes will result in a decrease in the accuracy of the AI defect identification models corresponding to the factory production line, and the models will need to be retrained.

The first product manufacturing assisting device (104-1) may manage these AI defect identification models based on site, product, time node, etc., and configure training and testing of new models, etc. Since each AI defect identification model needs to be trained, verified, tested, and evaluated before it can be used, in the case where the computational resources for training the AI defect identification models are limited, the first product manufacturing assisting device (104-1) can reasonably schedule and distribute training tasks of the AI defect identification models according to the priority, the training quantity, and the state of the hardware resources.

The first product manufacturing assisting device (104-1) may also realize the function of visualizing the training of the AI defect identification models, so that the relevant staff can observe the status of the training of the AI defect identification models in real-time (for example, whether the training of an AI defect identification model converges), and determine whether to stop or adjust the training procedure. With the continuous enrichment of data sets and the continuous optimization of training parameters, as for the same product or product defect detection, if the newly trained defect identification model has a better effect than the old defect identification model, the first product manufacturing assisting device (104-1) may also update the AI defect identification model in a defect identification model library. The first product manufacturing assisting device (104-1) can also launch a training task and evaluate the AI defect identification model in real time according to procedure information (for example, Loss, verification accuracy, etc.) that is feedback in the model training procedure, to determine if the model training procedure is working properly. The first product manufacturing assisting device (104-1) may also be configured to add, delete, modify and edit training sets, verification sets, and test sets required for training. The first product manufacturing assisting device (104-1) may also be configured to deploy the AI defect identification model according to product requirements and perform evaluation and testing, etc. before deployment. The foregoing description of the functions of the first product manufacturing assisting device (104-1) is merely exemplary, and one of skill in the art should understand that the first product manufacturing assisting device (104-1) may also perform many more functions not mentioned, and the present disclosure is not limited thereto.

After the first product manufacturing assisting device (104-1) completes the product defect analysis task (e.g., determining the AI defect identification model corresponding to the product type), the first product manufacturing assisting device (104-1) may send a first product defect analysis response message to the product manufacturing message processing device (103). In sub-operation 233, the first product defect analysis response message sent by the first product manufacturing assistant (104-1) is received by the product manufacturing message processing device (103). The first product defect analysis response message includes one or more of the following: the identification, accuracy, and recall of the AI defect identification model. Among other things, the AI defect identification model is determined based on the product type, the storage address of the product images, and the quantity of product images in the first product defect analysis request message.

In a case where the AI defect identification model corresponding to the product type is present, in sub-operation 234, a second product defect analysis request message is sent by the product manufacturing message processing device (103) to the second product manufacturing assisting device. The second product defect analysis request message includes the product type, the storage address of the product images, and the quantity of product images. The second product defect analysis request message corresponds to the task of identifying product defect content based on the AI defect identification model among the product defect analysis tasks.

The second product manufacturing assisting device (104-2) may be a GPU cluster, which may realize, for example, functions such as inferring and training tasks by AI defect identification models using GPU computing resources, scheduling and allocation of hardware resources, and the like. For example, the second product manufacturing assisting device (104-2) may implement the functionality of loading the AI defect identification models. As there are a large number of products and sites and the loading time of the AI defect identification models is long, the second product manufacturing assisting device (104-2) may load the AI defect identification models in advance by default. After the settings are changed, the second product manufacturing assisting device (104-2) may also utilize an independent background server to complete the loading of the models, so as to avoid consuming a large amount of time required for loading the models when the product changes, thereby improving the overall efficiency. As the production-line may generate a large number of images every day for the detection of the defect identification model algorithm, the second product manufacturing assisting device (104-2) can also perform reasonable scheduling and distribution of GPU resources, thereby improving the use efficiency of hardware resources. The second product manufacturing assisting device (104-2) may also test the AI defect identification models to determine how well the AI defect identification models identify the defects. The foregoing description of the functions of the second product manufacturing assisting device (104-2) is only an example, and one of skill in the art should understand that the second product manufacturing assisting device (104-2) may also perform many more functions not mentioned, and the present disclosure is not limited thereto.

After the second product manufacturing assisting device (104-2) completes the product defect analysis task (e.g., inferring and analyzing the product defects), the second product manufacturing assisting device (104-2) may send a second product defect analysis response message to the product manufacturing message processing device (103). In sub-operation 235, the second product defect analysis response message sent by the second product manufacturing assistant is received by the product manufacturing message processing device (103). The second product defect analysis response message includes one or more of the following: product image identification, product defect location, product defect identity, and repair identity. The product defect location, product defect identity, and repair identity are determined based on the product type, the storage address of the product images, and the quantity of the product images in the second product defect analysis request.

Optionally, the product manufacturing message processing device (103) may also monitor one or more of the accuracy, precision, recall, F-score, and speed, with which the product manufacturing assisting device (104) processes the product defect analysis task. For example, one or more of accuracy, precision, recall, F-score, and speed, with which the product manufacturing assisting device (104) processes a task of identifying product defect content based on an AI defect identification model is monitored. The speed may refer to the speed at which the second product manufacturing assisting device (104-2) processes the product images (which may be measured in terms of the quantity of product images/sec, etc.), or the speed at which a single AI defect identification model is trained (which may be measured in terms of the quantity of trained models/hour, etc.).

In the manufacturing procedure of the factory, the backgrounds of the product circuits are complex and diverse. Many product defects can be easily confused, and the production plan of the products may also be adjusted according to product orders. These factors bring great challenges to model performances. Changes in products, changes in process, or adjustments of the product images may cause the performances of the AI defect identification models to deteriorate. The product manufacturing message processing device (103) may monitor the performances of the AI defect identification models at a fixed period or in real-time. If the performances of any product defect identification model cannot satisfy production requirements, adjustment is made in real-time. For example, the product manufacturing message processing device (103) may alert in time if there is a problem, and deploy and confirm a new defect identification model.

Optionally, the product manufacturing message processing device (103) may also monitor the inference performances of the product defect identification models. The inference performance is one or more of: accuracy, precision, recall, FScore, and speed, with which the first product defect identification task is processed based on the product defect identification model. Among which, the speed may indicate the speed at which the second product manufacturing assisting device (104-2) identifies the product images (which may be measured in terms of the quantity of product images/sec, etc.). The accuracy can be calculated by the following formula (1). The precision can be calculated by the following formula (2). The recall can be calculated by the following formula (3). Subsequently, the FScore is calculated by the following formula (4).

$$\text{Accuracy} = \frac{(TP+TN)}{(TP+FP+TN+FN)}; \quad (1)$$

$$\text{Precision} = \frac{TP}{(TP+FP)}; \quad (2)$$

$$\text{Recall} = \frac{TP}{(TP+FN)}; \quad (3)$$

$$FScore = \frac{[(1+\beta^2) \cdot \text{Precision} \cdot \text{Recall}]}{(\beta^2 \cdot \text{Precision} + \text{Recall})}. \quad (4)$$

Wherein, True-Positive (TP) indicates that the calculation result is positive and the actual result is also positive, that is, the calculation result obtained after the inference calculation by the AI defect identification model is A (herein, A represents one result), and the actual result is also A. At this point, the calculation result is consistent with the actual result.

False-Positive (FP) indicates that the calculation result is positive and the actual result is negative, that is, the calculation result obtained after the inference calculation by the AI defect identification model is A but the actual result is not A. At this point, the calculation result is inconsistent with the actual result.

False-Negative (FN) indicates that the calculation result is negative and the actual result is positive, that is, the calculation result obtained after the inference calculation by the AI defect identification model is not A but the actual result is A. At this point, the calculation result is inconsistent with the actual result.

True-Negative (TN) indicates that the calculation result is negative and the actual result is also negative, that is, the calculation result obtained after the inference calculation by the AI defect identification model is not A and the actual result is also not A. At this point, the calculation result is consistent with the actual result.

In the manufacturing procedure of the factory, the backgrounds of the product circuits are complex and diverse. Many product defects can be easily confused, and the production plan of the products may also be adjusted according to product orders. These factors bring great challenges to model performances. Changes in products, changes in process, or adjustments of the product images may cause the performances of the AI defect identification models to deteriorate. The product manufacturing message processing device (103) may monitor the performances of the AI defect identification models at a fixed period or in real-time. If the performances of any product defect identification model cannot satisfy production requirements, adjustment is made in real-time. For example, the product manufacturing message processing device (103) may alert in time if there is a problem, and deploy and confirm a new defect identification model.

The product manufacturing message processing device (103) may monitor, according to the following three methods, the accuracy, the precision, the recall, the FScore, and the like, with which the product manufacturing assisting device (104) processes the product defect identification tasks. It should be understood by those skilled in the art that the following three methods are only examples, and the product manufacturing message processing device (103) may also monitor the product defect analysis tasks according to other methods, as long as any of the accuracy, the precision, the recall or the FScore in processing the product defect analysis tasks can be obtained.

First Method: Monitoring Through Standard Data Samples

The standard data samples may be pre-stored in the product manufacturing message processing device (103). The standard data samples may be examined and verified by senior factory operators and senior inspectors to determine that the selection range (for example, the defect type, the defect quantity, the defect distribution, etc.) of the samples is kept consistent with that of training samples of the AI defect identification model. Subsequently, the product manufacturing message processing device (103) may compare the inference result through the AI defect identification model with corresponding manually set standard result, and then perform statistics on the accuracy, the precision, the recall, or the FScore and processing speed of the AI defect identification model. Meanwhile, the product manufacturing message processing device (103) may also be configured to update the standard data samples according to the time period, production condition, manual adjustment, etc.

Second Method: Monitoring Through an Online Sampling Model

In the manufacturing procedure of the factory, a plurality of (for example, 3) superior inspectors may perform a random inspection on the product defects. For example, these superior inspectors may extract a plurality of product defect images (for example, 100 product defect images) for a certain product defect, and then manually judge and label the product defects. Subsequently, a plurality of inspectors may independently review the inference results of the AI defect identification model for the same sample (product defect) by using the labeled product defects. After the end of review, the plurality of inspectors can vote on inference results of the same product defect, and the inference result with highest number of votes may be taken as a standard result for the product defect. Subsequently, the standard result is compared with the inference result of the AI defect identification model to monitor the accuracy, the precision, the recall, or the FScore of the AI defect identification model.

Third Method: Monitoring Based on Extracting LOT Products

A plurality of (for example, 3) superior inspectors may extract the AI defect identification model to review the inference results of the product defects of the entire LOT (for example, one LOT, where one LOT may include 20 Glass, and each Glass may include 50 to 300 product defects) products. The product manufacturing message processing device (103) obtains review results and determines the accuracy, the precision, the recall, or the FScore of the AI defect identification model according to the review results.

The product manufacturing message processing device (103) may also be configured to monitor the status of manual resources for defect identification. For example, in the manufacturing procedure of the factory, there may be cases where the tasks to be processed cannot be processed in time due to the low working efficiency of operators, or, some important alarm information cannot be processed by the operators in time. These cases may bring great loss to production. Thus, the product manufacturing message processing device (103) may also be configured to monitor the status of the product manufacturing assisting device (104) for the manual identification of the product defects. For example, the product manufacturing message processing device (103) may be configured to monitor the speed of the manual processing on the product defects, which is pushed to the product manufacturing assisting device (104) (for example, monitoring whether the operators perform the manual identification on the product images at normal speed), and determine the working efficiency and the working status of the operators, thereby optimizing the allocation of tasks of product defect identification/detection in combination with the scheduling plan.

In the manufacturing procedure of the factory, the product manufacturing message processing device (103) may also monitor the usage efficiency of computing resources for the AI defect identification models. If the inference of defect identification cannot be completely finished by using almost all the computer resources, at this point, hardware resources and the like may be required to be dynamically added. The product manufacturing message processing device (103) can monitor the usage efficiency of the computing resources in GPU cluster, including usages of memory and video memory, to determine whether there are anomalies in GPU resources, etc.

The product manufacturing message processing device (103) may also be configured to monitor the alarm status in the factory system. In the procedure of product defect detection, large-scale defect aggregation may occur. The product manufacturing message processing device (103) may be configured to match product defect information with the sections or departments that handle the product defect in the factory, and send alarm information in time to these departments. If the product defect requires the corresponding department to perform process or production adjustment on the defect, the product manufacturing message processing device (103) may be configured to monitor the alarm information and the state of the alarm being processed in real-time. Moreover, in the event of a serious alarm not being handled in time, the product manufacturing message processing device (103) may be configured to automatically upgrade the alarm level, and meanwhile, send the information of the upgraded alarm level to the higher-level department to urge the corresponding department to pay attention to and handle the serious alarm in time.

Optionally, the product manufacturing message processing device (103) may also obtain analysis result data for a plurality of product defect analysis tasks. Also, the product manufacturing message processing device (103) may integrate the aforementioned analysis result data based on one or more of: product defect type, format of the result data, and way to resolve the problems of product defect.

During the manufacturing procedure, there are hundreds types of various product defects due to the presence of various influencing factors, but not all of these product defects affect the final quality of the products, and not all of the product defects affecting the final quality of the products can be fixed. The product manufacturing message processing device (103) can integrate the analysis result data to provide the diverse analysis result data to other devices in a timely manner, thereby facilitating the provision of alarm information and guidance for subsequent process operations, etc. The product manufacturing message processing device (103) may integrate the results of the judgments of the product defect models with the results of the manual review. The product manufacturing message processing device (103) may also integrate the judgments of the product defect models with process rules, etc.

For example, the product manufacturing message processing device (103) may integrate the analysis result data described above according to the product defect type. For semiconductor manufacturing processes, the defect types may include particles, remain, line, hole, splash, electro-static breakdown (ESD), wrinkle, film color, bubble, and the like, each type of which belong to a major category. In addition, where necessary, each major category is further subdivided into multiple minor categories, e.g., the major category of particles are divided into P0 to P9, which refer to different forms of dust defects respectively. The product manufacturing message processing device (103) may firstly integrate the product defects of the major categories based on the correspondence between the minor and major categories described above (which may be many-to-many) in order to determine how to subsequently repair and process these product defects. For example, cutting may be required for a Short type product defect, while joining may be required for an Open type product defect, etc. The product manufacturing message processing device (103) can also integrate and count information about the product defect type to determine which department or section to complete the subsequent processing. If a sudden situation where product defects of a critical type are generated on a large scale arises, the product manufacturing message processing device (103) sends a large amount of alarm information to the corresponding section. The product manufacturing message processing device (103) may also continue to integrate the product defects of minor categories. For example, the product defects of a same minor category may exhibit different patterns and need to be processed by different departments (Sputter/PECVD), the product manufacturing message processing device (103) may integrate different information, classify them, and push them to different departments.

In some embodiments, the product defect analysis tasks also includes a task of analyzing the causes of generating the product defects. The product manufacturing message processing device (103) obtains the product defect content (defect type, defect location, defect size, etc.) of the product defects, as well as manufacturing process information related to the generation of the product defect content. The manufacturing process information related to the generation of the product defect content includes, for example, the time of manufacturing the current product, environmental information (e.g., including temperature, humidity, pressure, etc.), operator information, equipment parameter information, material information, configuration information, etc. The product manufacturing assisting device (104) cleans (removes invalid and problematic data), integrates (integrates into the required standard data format), data mines and analyzes (e.g., performs data processing on the integrated data in unsupervised modes such as classification, clustering, feature extraction, dimensionality reduction, and correlation analysis) the aforementioned information (product defect content, as well as manufacturing procedure information relevant to the generation of said product defect content). Then, a defect cause analysis model is obtained. The product manufacturing assisting device (104) receives data generated during the product manufacturing process and can get the causes of the current product defects based on the defect cause analysis model described above. The causes of the current product defects include, for example, insufficient strength of the cleaning process in the semiconductor generation procedure, insufficient corrosion, excessive corrosion, inaccurate matching of raw materials, excessive dust in the cleaning environment, insufficient exposure intensity, excessive exposure intensity, foreign matter doping, and so on. The product manufacturing message processing device (103) can provide corresponding adjustment recommendations for process and/or equipment according to the causes of current product defects.

Figure 7:
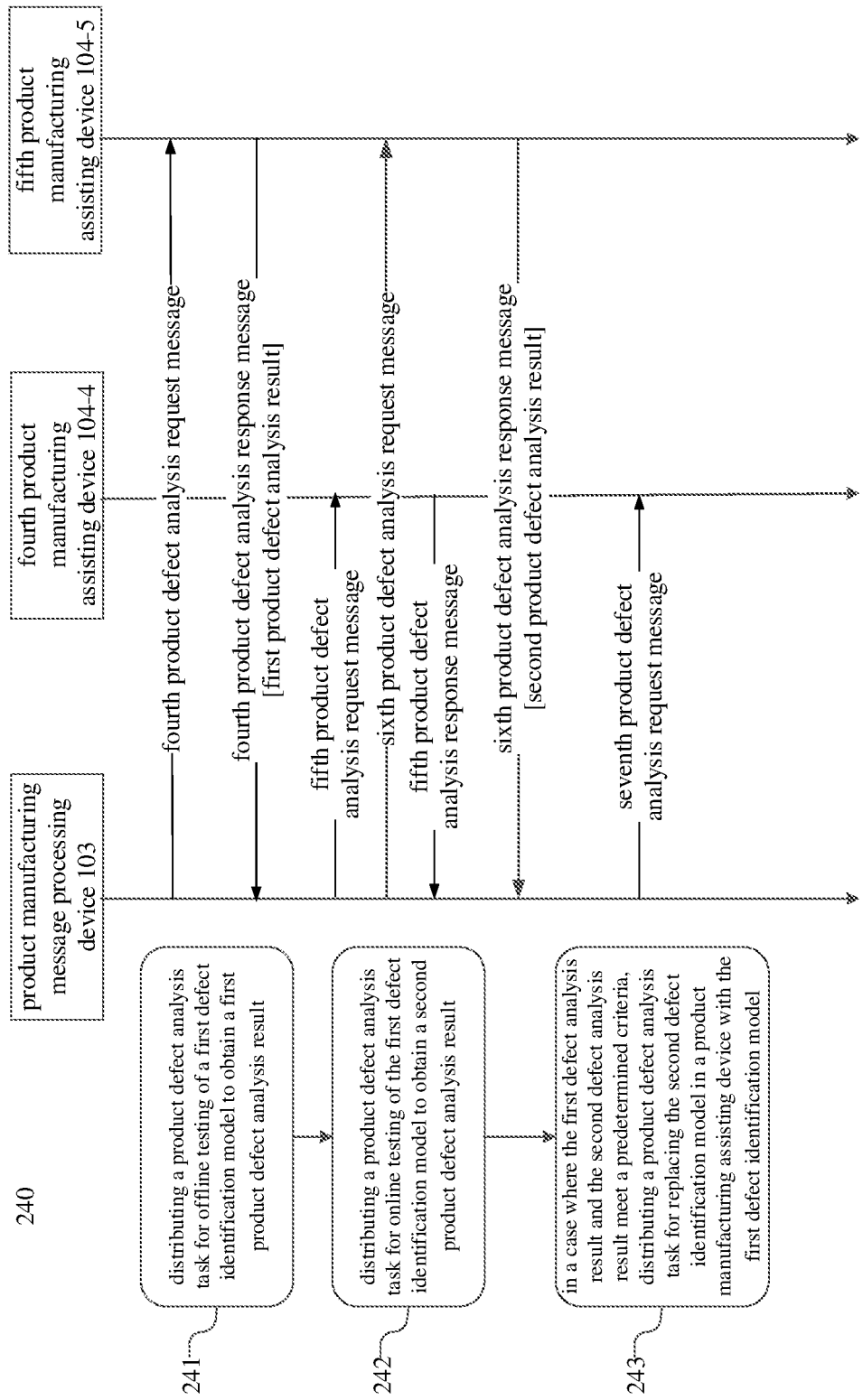
FIG. 7 is another schematic diagram illustrating the method for processing product manufacturing messages according to at least one embodiment of the present disclosure.

FIG. 7 is another schematic diagram illustrating the method (200) for processing product manufacturing messages according to at least one embodiment of the present disclosure.

Referring to FIG. 7, the method (200) for processing product manufacturing messages may also include all or some of the sub-operations in the operation 240. In the operation 240, the product manufacturing message processing device (103) may update the AI defect identification model of the product manufacturing assisting device (104).

Optionally, the operation 240 includes sub-operations 241 to 243.

In sub-operation 241, a product defect analysis task for offline testing of a first AI defect identification model is distributed by the product manufacturing message processing device (103), to obtain a first product defect analysis result. Assuming that at this time, a second AI defect identification model is being used in the fourth product manufacturing assisting device (104-4) to analyze product defects of the product type. The product manufacturing message processing device (103) may use the data generated by the second AI defect identification model through inference as a test set to test the first AI defect identification model offline, to compare the first AI defect identification model and the second AI defect identification model and to determine which one is better. Optionally, the inspectors in the factory may also review and label the data generated by the second AI defect identification model through inference, and the product manufacturing message processing device (103) may then take the reviewed and labeled data as a test set for further test.

As shown in FIG. 7, the product manufacturing message processing device (103) initiates offline testing of a newly trained model, and the product manufacturing message processing device (103) distributes the product defect analysis tasks by sending a fourth product defect analysis request message to the fifth product manufacturing assisting device (104-5), and the fourth product defect analysis request message contains the storage path of the first product defect identification model and the storage path of the test set required for offline testing. The fifth product manufacturing assisting device (104-5), after parsing the fourth product defect analysis request message, may schedule product defect model testing algorithm to perform the testing of the first AI defect identification model. After the testing of the first product defect model is completed, the product manufacturing message processing device (103) obtains the first product defect analysis result, which indicates the accuracy, speed, etc. of analyzing the product defects by the first product defect model. If the first product defect analysis result meets a predetermined criterion (e.g., the accuracy of the first product defect analysis result is greater than the accuracy of the second AI defect identification model), the inspectors may confirm to perform the next test procedure, or it may proceed directly to operation 242. Those of skill in the art should understand that the aforementioned predetermined criteria may also include a comparison of any one of the metrics such as recall rate, F1-Score, etc., of the first product defect analysis result with the analysis result produced by the second AI defect identification model for the same data set, and the predetermined criteria does not limited by the present disclosure as long as it can determine which one of the two AI defect identification models is better.

In sub-operation 242, a product defect analysis task for online testing of the first AI defect identification model is distributed by the product manufacturing message processing device (103), to obtain a second product defect analysis result.

The online test of the first AI defect identification model may also be referred to as the grayscale deployment procedure of the first AI defect identification model. The product manufacturing message processing device (103) may perform an online test on the first defect identification model by using real-time data generated on the production-line of the factory. Both the first AI defect identification model and the second AI defect identification model respectively use the same real-time data and generate different product defect inference results through inference. At this point, the product defect inference result generated by the first AI defect identification model through inference is the second product defect analysis result described above. The product manufacturing message processing device (103) may further analyze whether the second product defect analysis result meets the predetermined criteria (e.g., whether it is better than the product defect inference result produced by the second AI defect identification model through inference based on the same data). Those of skill in the art should understand that the aforementioned predetermined criteria may also include a comparison of any one of the metrics such as recall rate, F1-Score, etc., of the first product defect analysis result with the analysis result produced by the second AI defect identification model for the same data set, and the predetermined criteria does not limited by the present disclosure as long as it can determine which one of the two AI defect identification models is better.

As shown in FIG. 7, if the first AI defect identification model passes offline testing, the product manufacturing message processing device (103), after reading the data generated in real time on the production-line, copies that data into two copies. The two copies are distributed to a fourth product manufacturing assisting device (104-4) (e.g., a fifth product defect request message is sent to the fourth product manufacturing assisting device (104-4) that performs a product defect identification inference task using the second AI defect identification model, and a fifth product manufacturing assisting device (104-5) (e.g., a sixth product defect request message is sent to the fifth product manufacturing assisting device (104-5) that performs online testing of the first AI defect identification model. The fourth product manufacturing assisting device (104-4) and the fifth product manufacturing assisting device (104-5) may be the above GPU cluster and may also be other devices capable of executing the analysis or test of the AI defect identification model. The fourth product manufacturing assisting device (104-4) and the fifth product manufacturing assisting device (104-5) may be the same device and may also be different devices. There is no limitation thereto in the present disclosure.

After the fourth product manufacturing assisting device (104-4) and the fifth product manufacturing assisting device (104-5) receive the product defect analysis request message sent by the product manufacturing message processing device (103) for online testing, the fifth product manufacturing assisting device (104-5) may schedule an AI online testing algorithm to perform online testing of the first product defect model (the first AI defect identification model). The online test of the first AI defect identification model and the inference of the second AI defect identification model are synchronously performed, and data sources of both are consistent. Similarly, the product manufacturing message processing device (103) sends a testing task of the first AI defect identification model to the fifth product manufacturing assisting device (104-5) in a form of a product defect request message. The fifth product manufacturing assisting device (104-5) may obtain a storage address for the data set required for online testing of the first AI defect identification model and a storage address for the first AI defect identification model from the product defect request message. The fifth product manufacturing assisting device (104-5) may then schedule an AI algorithm to perform an online testing task of the first AI defect identification model. The fifth product manufacturing assisting device (104-5) may return a second product defect analysis result to the product manufacturing message processing device (103) via a sixth product defect analysis response message.

In the case where the first product defect analysis result and second product defect analysis result meet the predetermined criteria, in sub-operation 243, a model replacement request (e.g., the seventh product defect analysis request message illustrated) is sent by the product manufacturing message processing device (103) to the fourth product manufacturing assisting device (104-4) to replace the second AI defect identification model in the fourth product manufacturing assisting device (104-4) with the first AI defect identification model.

After the above three sub-operations, the first AI defect identification model trained by the product manufacturing assisting device (104) can be easily tested offline, efficiently and visually deployed in grayscale (online tested), and updated throughout the release process.

The grayscale deployment and the online test do not affect the real-time inference task of the original defect identification model (the second AI defect identification model) on the production-line, then the normal production on the production-line is not affected, and large loss caused by a system shutdown and the like due to the deployment of the new defect identification model (the first AI defect identification model) using traditional manual test would not happen. Moreover, test data used in the grayscale deployment procedure is review results in the product manufacturing message processing device (103) after the review of the inspectors and real-time inferred data generated by the old defect identification model. Other test data is not used, thereby saving the cost of collecting a large amount of data.

Thus, at least one embodiment of the present disclosure makes reasonable use of the data generated by the entire automated defect classification system, achieving data recycling and reducing the cost of collecting training data and testing data. The product manufacturing message processing device (103) completes offline testing and gray-scale deployment functions of the new model without affecting the production line, avoiding the loss of the artificial intelligence defect identification model due to the need for shutdown for testing and updating. According to embodiments of the present disclosure, the process described above may also be implemented as a computer software program. For example, embodiments of the present disclosure include a computer program product comprising a computer program tangibly contained on a machine-readable medium, the computer program comprising program code for implementing methods described above. According to embodiments of the present disclosure, a computer-readable storage medium with instructions stored thereon is provided, and when the programs instructions are executed by a processor, the methods described above are implemented.

Figure 8:
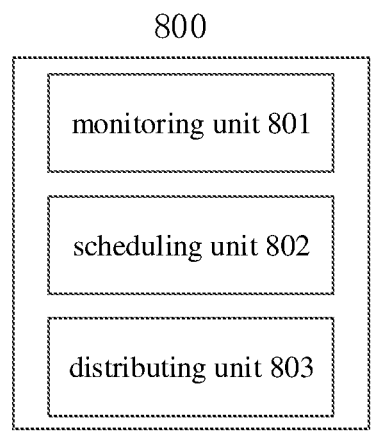
FIG. 8 is a schematic diagram illustrating a device for processing product manufacturing messages according to at least one embodiment of the present disclosure.

FIG. 8 is a diagram illustrating a device (800) for processing product manufacturing messages according to at least one embodiment of the present disclosure.

The device (800) for processing product manufacturing messages may include: a monitoring unit 801, configured to monitor a plurality of product manufacturing messages; a scheduling unit 802, configured to establish a product defect analysis task queue based on the plurality of product manufacturing messages; and a distribution unit 803, configured to distribute product defect analysis tasks to the product manufacturing assisting devices based on the product defect analysis task queue.

Figure 9:
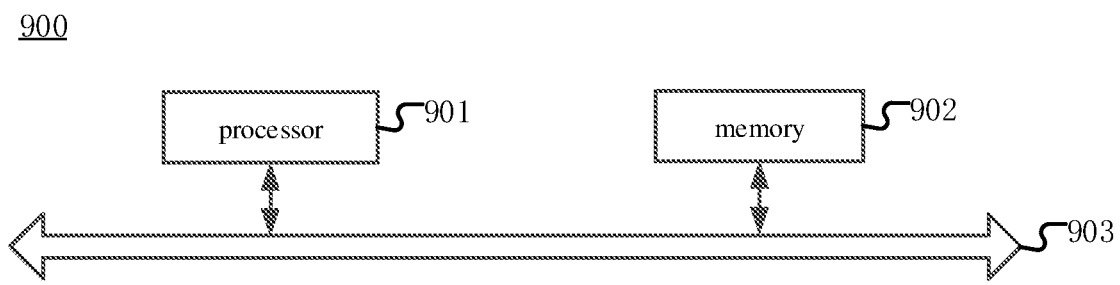
FIG. 9 is a structural diagram illustrating an electronic device according to at least one embodiment of the present disclosure.

FIG. 9 is a structural diagram illustrating an electronic device 900 according to at least one embodiment of the present disclosure.

Referring to FIG. 9, the electronic device 900 according to at least one embodiment of the present disclosure may include a processor 901 and a memory 902. Both the processor 901 and the memory 902 may be connected via a bus 903. The electronic device 900 may be a tower server, a rack server (Rack), a blade server (Blade Server), a cabinet server, and the like.

The processor 901 may perform various actions and processing based on a program stored in the memory 902. Specifically, the processor 901 may be an integrated circuit chip with signal processing capability. Said processor may be a general purpose processor, a digital signal processor (DSP), a special purpose integrated circuit (ASIC), an off-the-shelf programmable gate array (FPGA) or other programmable logic device, a discrete gate or transistor logic device, or a discrete hardware component. Each of the methods, steps, and logic block diagrams disclosed in the examples of this application may be implemented or performed. The general-purpose processor may be a microprocessor or the processor may also be any conventional processor, etc., and may be of the x86 or ARM architecture.

Memory 902 stores computer instructions that implement the above methods 200 when the computer instructions are executed by processor 901. The memory 902 may be volatile or non-volatile memory, or may include both volatile and non-volatile memory. The non-volatile memory may be read-only memory (ROM), programmable read-only memory (PROM), erasable programmable read-only memory (EPROM), electrically erasable programmable read-only memory (EEPROM), or flash memory. Volatile memory may be random access memory (RAM), which is used as an external cache. By way of illustrative but not limiting illustration, many forms of RAM are available, such as static random access memory (SRAM), dynamic random access memory (DRAM), synchronous dynamic random access memory (SDRAM), double data rate synchronous dynamic random access memory (DDRSDRAM), enhanced synchronous dynamic random access memory (ESDRAM), synchronous Link Dynamic Random Access Memory (SLDRAM) and Direct Memory Bus Random Access Memory (DMBRAM). It should be noted that the memory for the methods described herein is intended to include, but not be limited to, these and any other suitable types of memory.

The present disclosure of at least one embodiment of a method for processing product manufacturing messages, device, and electronic device can improve the efficiency of product manufacturing message processing throughout the product manufacturing process, so that each device involved in product defect detection and analysis operates efficiently, facilitating subsequent defect cause finding and analysis, and improving the efficiency of product manufacturing.

It is noted that the flowcharts and block diagrams in the accompanying drawings illustrate the architecture, functionality, and operation of possible implementations of systems, methods, and computer program products in accordance with various embodiments of the present disclosure. In this regard, each box in the flowchart or block diagram may represent a module, segment, or portion of code that contains one or more executable instructions for implementing a specified logical function. It should also be noted that in some of the as-replaced implementations, the functions labeled in the boxes may also occur in a different order than those labeled in the accompanying drawings. For example, two successively represented boxes may actually be executed in substantially parallel, and they may also sometimes be executed in the reverse order, depending on the function involved. It should also be noted that each box in the block diagram and/or flowchart, and combinations of boxes in the block diagram and/or flowchart, may be implemented using a dedicated hardware-based system that performs the specified function or operation, or may be implemented using a combination of dedicated hardware and computer instructions.

In general, various example embodiments of the present disclosure may be implemented in hardware or proprietary circuitry, software, firmware, logic, or any combination thereof. Some aspects may be implemented in hardware, while other aspects may be implemented in firmware or software that can be executed by a controller, microprocessor, or other computing device. When aspects of embodiments of the present disclosure are illustrated or depicted as block diagrams, flowcharts, or represented using certain other graphics, it will be understood that the boxes, devices, systems, techniques, or methods described herein may be implemented as non-limiting examples in hardware, software, firmware, dedicated circuitry or logic, general purpose hardware or controllers or other computing devices, or some combination thereof.

The processor in at least one embodiment of the present disclosure may be an integrated circuit chip with signal processing capability. Said processor may be a general-purpose processor, a digital signal processor (DSP), an application-specific integrated circuit (ASIC), an off-the-shelf programmable gate array (FPGA) or other programmable logic device, a discrete gate or transistor logic device, or a discrete hardware component. Various methods, steps, and logic block diagrams of the disclosure in the examples of this application may be implemented or performed. The general-purpose processor may be a microprocessor or the processor may also be any conventional processor, etc., and may be of the x86 or ARM architecture.

The computer-readable storage medium of at least one embodiment of the present disclosure may be volatile memory or non-volatile memory, or may include both volatile and non-volatile memory. The non-volatile memory may be read-only memory (ROM), programmable read-only memory (PROM), erasable programmable read-only memory (EPROM), electrically erasable programmable read-only memory (EEPROM), or flash memory. The volatile memory may be random access memory (RAM), which is used as an external cache. By way of illustrative but not limiting illustration, many forms of RAM are available, such as static random access memory (SRAM), dynamic random access memory (DRAM), synchronous dynamic random access memory (SDRAM), double data rate synchronous dynamic random access memory DDRSDRAM), enhanced synchronous dynamic random access memory (ESDRAM), synchronous Linked Dynamic Random Access Memory (SLDRAM) and Direct Memory Bus Random Access Memory (DMBRAM). It should be noted that the memory for the systems and methods described herein is intended to include, but not be limited to, these and any other suitable types of memory.

It should be noted that the flowcharts and block diagrams in the accompanying drawings illustrate the architecture, functionality, and operation that may be implemented in systems, methods, and computer program products in accordance with various embodiments of the present disclosure. In this regard, each box in the flowchart or block diagram may represent a module, segment, or portion of code that contains one or more executable instructions for implementing a specified logical function. It should also be noted that, in some implementations as substitutions, the functions labeled in the boxes may also occur in a different order than those labeled in the accompanying drawings. For example, two successively represented boxes may actually be executed in substantially parallel, and they may also sometimes be executed in the reverse order, depending on the function involved. It should also be noted that each box in the block diagram and/or flowchart, and combinations of boxes in the block diagram and/or flowchart, may be implemented using a dedicated hardware-based system that performs the specified function or operation, or may be implemented using a combination of dedicated hardware and computer instructions.

In general, various example embodiments of the present disclosure may be implemented in hardware or dedicated circuitry, software, firmware, logic, or any combination thereof. Some aspects may be implemented in hardware, while other aspects may be implemented in firmware or software that can be executed by a controller, microprocessor, or other computing device. When aspects of embodiments of the present disclosure are illustrated or described as block diagrams, flowcharts, or represented using certain other graphics, it will be appreciated that the boxes, devices, systems, techniques, or methods described herein may be implemented as non-limiting examples in hardware, software, firmware, specialized circuitry or logic, general-purpose hardware, or controllers or other computing devices, or some combination thereof.

The example embodiments of the invention described in detail above are merely illustrative and not limiting. Those of skill in the art should understand that various modifications and combinations of these examples or features thereof may be made without departing from the principles and spirit of the present invention, and that such modifications should fall within the scope of the present invention.

The invention claimed is:

1. A method for processing product manufacturing messages, comprising:
   monitoring a plurality of product manufacturing messages;
   establishing a product defect analysis task queue based on the plurality of product manufacturing messages; and
   distributing product defect analysis tasks to product manufacturing assisting devices based on the product defect analysis task queue, wherein the product defect analysis tasks include a task of identifying product defect content based on a defect identification model;
   wherein the product defect content includes any one or more of: product defect type, product defect location, and product defect size;
   wherein the plurality of product manufacturing messages include at least one single-product manufacturing message and at least one LOT-products manufacturing message, and the monitoring the plurality of product manufacturing messages comprises:

monitoring LOT-products manufacturing messages by interrupt, the LOT-products manufacturing message being a collection of product manufacturing messages of the plurality of products of the same LOT; and monitoring single-product manufacturing messages by polling during interruption intervals, the single-product manufacturing message being product manufacturing messages of a single product.

2. The method for processing product manufacturing messages according to claim 1, further comprising:

sending registration information to a product manufacturing message serving device, wherein the registration information includes product manufacturing site information and/or first product information;

monitoring a first product manufacturing message sent from the product manufacturing message serving device, based on the registration information, wherein the first product manufacturing message is associated with the product manufacturing site information and/or the first product information.

3. The method for processing product manufacturing messages according to claim 2, further comprising:

monitoring a second product manufacturing message sent from the product manufacturing message serving device, wherein the second product manufacturing message is irrelevant to the registration information;

determining whether a list of product manufacturing keywords includes a product manufacturing keyword in the second product manufacturing message;

reserving the second product manufacturing information in a case where the list of product manufacturing keywords includes the product manufacturing keyword in the second product manufacturing message; and discarding the second product manufacturing information in a case where the list of product manufacturing keywords does not include the product manufacturing keyword in the second product manufacturing message.

4. The method for processing product manufacturing messages according to claim 1, wherein, the establishing the product defect analysis task queue based on the plurality of product manufacturing messages further comprises:

establishing the product defect analysis task queue by sorting the product defect analysis tasks based on any one or more of: the order in which the product manufacturing messages are received, priorities of products, and a product scheduling plan.

5. The method for processing product manufacturing messages according to claim 1, wherein, the defect identification model includes any one or more of: a feedforward neural network defect identification model, a convolutional neural network model, a recurrent neural network model, and a generative adversarial network model.

6. The method for processing product manufacturing messages according to claim 1, further comprising:

obtaining a plurality of product images based on the plurality of product manufacturing messages;

obtaining product defects from the plurality of product images; wherein the obtaining product defects from the plurality of product images comprises any one or more of:

performing any one or more of: rotation, scaling, color transformation and interception of a product image of the plurality of product images in a case of an uneven distribution of the quantity of the product defects in the product image;

magnifying an image region in which a product defect is located in a case where the image region is smaller than a first predetermined threshold;

merging product images corresponding to any two product defects in a case where a similarity between the two product defects is greater than a second predetermined threshold; and obtaining a frequency domain image of a product image of the plurality of product images in a case where a similarity between positive samples and negative samples in the product image is greater than a third predetermined threshold, and adjusting the positive samples or negative samples based on the frequency domain image;

generating the product defect analysis tasks based on the product defects.

7. The method for processing product manufacturing messages according to claim 1, wherein the distributing product defect analysis tasks to product manufacturing assisting devices comprises:

obtaining a product type and a product defect analysis task type from the plurality of product manufacturing messages;

generating a product defect analysis request message based on the product type and the product defect analysis task type.

8. The method for processing product manufacturing messages according to claim 7, wherein the product manufacturing assisting devices include a first product manufacturing assisting device and a second product manufacturing assisting device, wherein the distributing product defect analysis tasks to product manufacturing assisting devices based on the product defect analysis task queue further comprises:

determining whether an AI defect identification model corresponding to the product type is present;

sending a first product defect analysis request message to the first product manufacturing assisting device in a case where the AI defect identification model corresponding to the product type is not present, wherein the first product defect analysis request message comprises the product type, a storage address of product images, a quantity of the plurality of product images, and a task identity for training the AI defect identification model;

sending a second product defect analysis request message to the second product manufacturing assisting device in a case where the AI defect identification model corresponding to said product type is present, wherein the second product defect analysis request message comprises the product type, a storage address of the product images, and a quantity of the product images.

9. The method for processing product manufacturing messages according to claim 8, further comprising:

receiving a first product defect analysis response message sent by the first product manufacturing assisting device, wherein the first product defect analysis response message comprises one or more of: identity, accuracy, and recall of the AI defect identification model;

wherein the AI defect identification model is determined based on the product type, the storage address of the product images, and the quantity of the product images.

10. The method for processing product manufacturing messages according to claim 8, further comprising:

receiving a second product defect analysis response message sent by the second product manufacturing assisting device, wherein the second product defect analysis response message comprises one or more of: product image identity, product defect location, product defect identity, and repair identity;

wherein the product defect location, the product defect identity and the repair identity are determined based on the product type, the storage address of the product images, and the quantity of the product images.

11. The method for processing product manufacturing messages according to claim 1, further comprising:

monitoring one or more of: accuracy, precision, recall, F-score, and speed of processing, by the product manufacturing assisting device, the product defect analysis tasks.

12. The method for processing product manufacturing messages according to claim 1, further comprising:

obtaining analysis result data from a plurality of product defect analysis tasks;

integrating the analysis result data based on one or more of: the product defect type, a result data format, and a manner in which problems of product defects are resolved.

13. The method for processing product manufacturing messages according to claim 12, further comprising:

sending a product defect alert based on the analysis result data.

14. The method for processing product manufacturing messages according to claim 1, further comprising:

updating the defect identification model.

15. The method for processing product manufacturing messages according to claim 14, wherein the updating the defect identification model further comprises:

distributing a product defect analysis task for offline testing of a first defect identification model to obtain a first product defect analysis result;

distributing a product defect analysis task for online testing of the first defect identification model to obtain a second product defect analysis result;

in a case where the first defect analysis result and the second defect analysis result meet a predetermined criteria, distributing a product defect analysis task for replacing the second defect identification model in a product manufacturing assisting device with the first defect identification model.

16. A computer-readable storage medium with computer instructions stored thereon, when the instructions are executed by a processor, the method according to claim 1 is implemented.

17. An electronic device, comprising:

a processor;

a memory, storing computer instructions that, when executed by the processor, implement the following steps:

monitoring a plurality of product manufacturing messages;

establishing a product defect analysis task queue based on the plurality of product manufacturing messages; and distributing product defect analysis tasks to product manufacturing assisting devices based on the product defect analysis task queue, wherein the product defect analysis tasks include a task of identifying product defect content based on a defect identification model;

wherein the product defect content includes any one or more of: product defect type, product defect location, and product defect size, wherein the plurality of product manufacturing messages include at least one single-product manufacturing message and at least one LOT-products manufacturing message, and the monitoring the plurality of product manufacturing messages comprises:

monitoring LOT-products manufacturing messages by interrupt, the LOT-products manufacturing message being a collection of product manufacturing messages of the plurality of products of the same LOT; and monitoring single-product manufacturing messages by polling during interruption intervals, the single-product manufacturing message being product manufacturing messages of a single product.

18. The electronic device according to claim 17, wherein, when are executed by the processor, the computer instructions further implement the following steps:

sending registration information to a product manufacturing message serving device, wherein the registration information includes product manufacturing site information and/or first product information;

monitoring a first product manufacturing message sent from the product manufacturing message serving device, based on the registration information, wherein the first product manufacturing message is associated with the product manufacturing site information and/or the first product information.

19. The electronic device according to claim 17, wherein, when are executed by the processor, the computer instructions further implement the following steps:

obtaining a plurality of product images based on the plurality of product manufacturing messages;

obtaining product defects from the plurality of product images; wherein the obtaining product defects from the plurality of product images comprises any one or more of:

performing any one or more of: rotation, scaling, color transformation and interception of a product image of the plurality of product images in a case of an uneven distribution of the quantity of the product defects in the product image;

magnifying an image region in which a product defect is located in a case where the image region is smaller than a first predetermined threshold;

merging product images corresponding to any two product defects in a case where a similarity between the two product defects is greater than a second predetermined threshold; and obtaining a frequency domain image of a product image of the plurality of product images in a case where a similarity between positive samples and negative samples in the product image is greater than a third predetermined threshold, and adjusting the positive samples or negative samples based on the frequency domain image;

generating the product defect analysis tasks based on the product defects.

* * * * *